(12) United States Patent
Furtner

(10) Patent No.: US 7,126,407 B2
(45) Date of Patent: Oct. 24, 2006

(54) METHOD AND DEVICE FOR GENERATING A CLOCK SIGNAL WITH PREDETERMINED CLOCK SIGNAL PROPERTIES

(75) Inventor: Wolfgang Furtner, Füstenfeldbruck (DE)

(73) Assignee: Koninklijke Philips Electronics N.V.(NL)

( * ) Notice: Subject to any disclaimer, the term of this patent is extended or adjusted under 35 U.S.C. 154(b) by 0 days.

(21) Appl. No.: 11/074,338

(22) Filed: Mar. 7, 2005

(65) Prior Publication Data

US 2005/0200393 A1    Sep. 15, 2005

Related U.S. Application Data

(63) Continuation of application No. PCT/EP03/11558, filed on Oct. 17, 2003.

(30) Foreign Application Priority Data

Oct. 25, 2002   (DE)   ................. 102 49 886

(51) Int. Cl.
*G06F 1/04* (2006.01)
(52) U.S. Cl. .................. 327/298; 327/99; 327/159
(58) Field of Classification Search ............ None
See application file for complete search history.

(56) References Cited

U.S. PATENT DOCUMENTS

| | | | | |
|---|---|---|---|---|
| 4,165,490 A |   | 8/1979 | Howe, Jr. et al. ........... 327/156 |
| 5,394,114 A |   | 2/1995 | Davis .......................... 331/1 A |
| 5,712,582 A | * | 1/1998 | Yokota et al. ............... 327/156 |
| 5,786,715 A |   | 7/1998 | Halepete ..................... 327/116 |
| 6,031,401 A | * | 2/2000 | Dasgupta ..................... 327/116 |
| 6,366,174 B1 | * | 4/2002 | Berry et al. .................. 331/78 |
| 6,441,659 B1 |   | 8/2002 | Demone ....................... 327/156 |
| 6,518,813 B1 | * | 2/2003 | Usui ............................. 327/291 |
| 6,563,860 B1 |   | 5/2003 | Schilling ..................... 375/148 |
| 6,650,160 B1 | * | 11/2003 | Tanahashi .................... 327/277 |
| 6,801,074 B1 | * | 10/2004 | Meguro ........................ 327/298 |
| 2002/0097176 A1 |   | 7/2002 | Herbold ....................... 341/155 |

FOREIGN PATENT DOCUMENTS

| | | |
|---|---|---|
| DE | 2851 519 | 4/1980 |
| DE | 199 33 115 | 1/2001 |
| DE | 100 84 500 | 6/2002 |
| EP | 1 137 188 | 9/2001 |

OTHER PUBLICATIONS

Bazes, Mel; "An Interpolating Clock Synthesizer"; IEEE, Roni Ashuri and Ernest Knoll; IEEE Journal of Solid State Circuits; vol. 31. No. 9, Sep. 1996.
PCT International Search Report; for PCT/EP 03/11558; in German.
2000217479; Mar. 16, 2001; Japanese Abstract.

* cited by examiner

*Primary Examiner*—Timothy P. Callahan
*Assistant Examiner*—An T. Luu
(74) *Attorney, Agent, or Firm*—Beyer Weaver & Thomas LLP

(57) ABSTRACT

A method and device for generating a clock signal with predetermined clock signal properties firstly prepare a number of clock signals with an essentially identical frequency and with a respectively different phase relation with regard to a master clock signal in order to subsequently (on the basis of a control signal, which is prepared according to the clock signal to be generated), select predetermined clock signals from the number of prepared clock signals and to combine the selected clock signals in order to generate the desired clock signal.

17 Claims, 22 Drawing Sheets

FIG 5
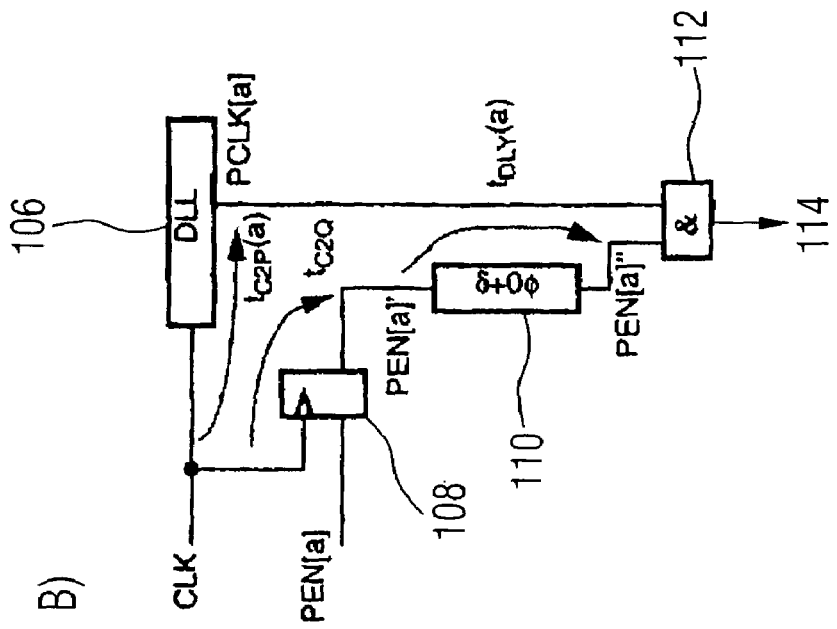
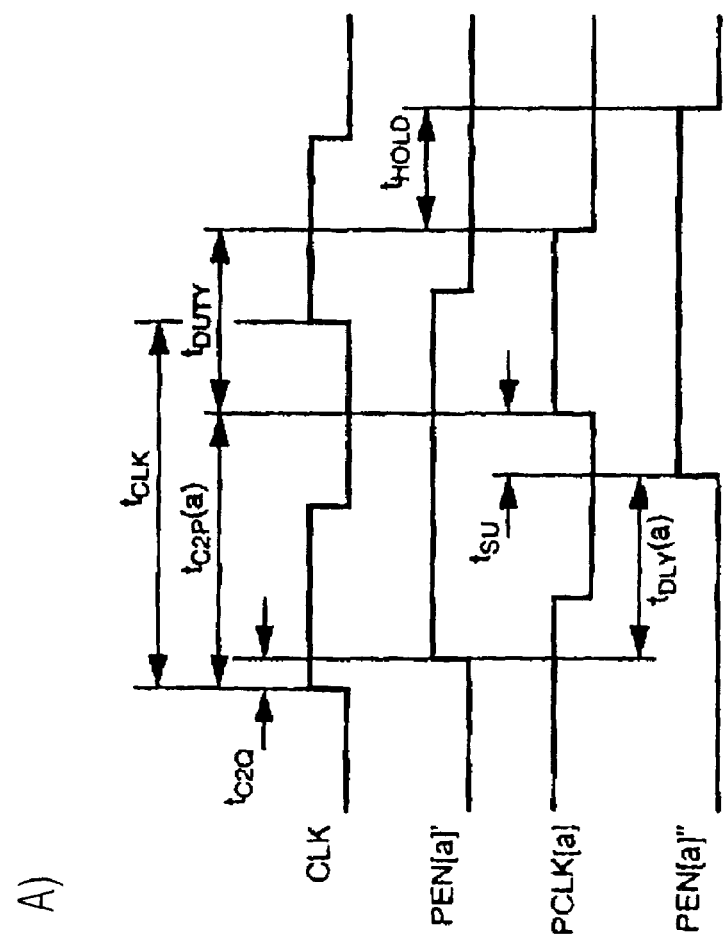

METHOD AND DEVICE FOR GENERATING A CLOCK SIGNAL WITH PREDETERMINED CLOCK SIGNAL PROPERTIES

CROSS-REFERENCE TO RELATED APPLICATION

This application is a continuation of copending International Application No. PCT/EP03/11558, filed Oct. 17, 2003, which designated the United States and was not published in English.

BACKGROUND OF THE INVENTION

1. Field of the Invention

The present invention relates to a system for a digital synthesis of several different clock signals (DCS=digital clock synthesis), and in particular to a method and a device for generating a clock signal having predetermined clock signal properties, and here in particular to a method and to a device for generating a clock signal with almost any desired frequency and a desired duty cycle.

2. Description of the Related Art

Traditionally, independent clock signals are generated using the known analog clock synthesis, wherein conventionally a plurality of PLLs (PLL=phase locked loop) are used. Such traditional approaches are disadvantageous, as here the overall jitter contribution is high and the clock accuracy is limited, as conventional analog PLLs are limited to discrete frequencies which are admitted by the PLL divider elements. A further disadvantage of conventional approaches is, that the analog circuits used require a plurality of circuit blocks, so that the circuit complexity is high. Further, the number of PLLs that may be realized on a single chip is limited, and thus also the number of available independent clock signals. Again, a further disadvantage of conventional approaches is, that for each of the PLLs used with conventional analog approaches an associated external analog power supply must be provided. The design expense for analog circuits is high.

EP 1 137 188 A2 describes a digital PLL in which only individual pulses of a multi-phase clock are selected that control a toggle flipflop which then generates a clock having a 50% duty cycle. A "traditional" PLL-loop with a digital phase comparator is used. A phase comparison sync/synth-.sync causes an iterative post-controlling of phase and frequency of the sample clock. It is not possible to generate (several) clocks with a binary programmable frequency, duty cycle and phase with any accuracy (not even integer) multiples of a sync clock.

U.S. Pat. No. 6,031,401 describes a clock signal synthesizer generating a time signal, which is a multiple of the frequency of a master clock signal. The synthesizer can programmably adjust the rising and falling edges of the synthesized wave form within the period of the master clock signal. The synthesizer has a delay line with several taps, which will generate repetitions of the master clock signal, which are incrementally delayed to the master clock signal. Part of the delay signals is provided as input signal to each of a plurality of multiplexers, wherein a delay signal is selected depending on a selection signal The selected delay signals are transmitted as input signals to flipflop circuits, the outputs of which are connected to a combinatorial logic, which will connect the signals from the outputs of the different flipflop circuits to generate the synthesized time signal.

U.S. Pat. No. 5,394,111 describes a programmable signal generator with a resolution of one nanosecond. The generator generates a clock signal having a frequency, a phase shift and a clock cycle, which is relative to a periodic reference signal. Therefore, the output signals of a voltage-controlled ring oscillator are used directly to drive the inputs of a programmable logic gate to generate pulses. The phase shift has a resolution of one nanosecond. Additionally, the generated pulses can be logically connected to generate clock signals with a multiple of the input frequency.

SUMMARY OF THE INVENTION

It is the object of the present invention to provide an improved method and an improved device for generating a clock signal having predetermined clock signal properties which prevent the above described disadvantages in the prior art.

In accordance with a first aspect, the present invention provides a method for generating a clock signal having predetermined clock signal properties, having the following steps: (a) providing a plurality of clock signals having substantially the same frequency and respectively different phase relations each regarding a master clock signal; and (b) based on a control signal, provided depending on the clock signal to be generated, selecting predetermined clock signals from the plurality of provided clock signals and combining the selected clock signals in order to generate the clock signal, characterized in that the control signal includes a plurality of enable signals, wherein an enable signal for each of the plurality of clock signals is provided, and wherein the enable signals are provided delayed in order to set an alignment of the same to guarantee the predetermined clock signal properties of the clock signal to be generated.

In accordance with a second aspect, the present invention provides a device for generating a clock signal having predetermined clock signal properties, having a multi-phase clock generator for providing a plurality of clock signals having generally the same frequency and different phase relations each regarding a master clock signal; and a phase overlay unit which selects predetermined clock signals from the plurality of provided clock signals based on a control signal provided depending on the clock signal to be generated, and which combines the selected clock signals in order to generate the clock signal, characterized in that the control signal includes a plurality of enable signals, wherein an enable signal for each of the plurality of clock signals is provided, and wherein the enable signals are provided delayed in order to set an alignment of the same to guarantee the predetermined clock signal properties of the clock signal to be generated.

According to a preferred embodiment of the present invention, when combining the selected clock signals, the pulses are combined with a high logic level of the selected clock signals, to generate the clock signal with a pulse having a high logic level and a predetermined pulse length. Using the provided control signal the duration of the individual pulses with a high logic level, the duration of the individual pulses with a low logic level and the shape of the pulse train of the clock signal to be generated are controlled. The shortest duration of a pulse having a high logic level is here determined to be the duration of a pulse having a high logic level of the master clock signal, and the shortest duration of a pulse having a low logic level is determined by the phase resolution that is achieved.

Preferably, the control signal includes a plurality of enable signals, wherein one enable signal is provided for each of a plurality of clock signals, and wherein the enable signals are provided delayed in order to set an orientation of the same, to guarantee the predetermined clock signal properties of the clock signal to be generated. Preferably, the enable signals are provided in the form of an enable signal sequence to generate a periodic clock signal having a predetermined frequency and predetermined duty cycle. The enable sequence is generated using a primary edge interpolator, a secondary edge calculator and a phase enable unit, wherein the primary edge interpolator determines a point of time or a temporary position (time stamp), respectively, of the leading edges in the clock signal to be generated, wherein the secondary clock calculator generates a point of time of the trailing edge in the clock signal to be generated based on the point of time of the leading edge, and wherein the phase enable unit generates the enable signal sequence based on the point of time of the leading edge and based on the point of time of the trailing edge.

A time stamp is set up by a serial number of a master clock cycle and a sub-cycle time (integer multiple of the master clock+section of the master clock).

According to a further preferred embodiment of the present invention, synchronized clock signals are generated, wherein here a defined phase and frequency relation to the synchronization signal is associated with the clock signal to be generated, wherein an edge detection unit is additionally provided to detect signal state changes in the synchronization signal to generate an edge pattern. Using an edge position decoder edges having a predetermined polarity, i.e. rising or falling edges, are determined in the edge pattern. Using a clock parameter calculator the period and the phase for the synchronized clock signal to be generated are determined based on the determined edges of the synchronization signal and subsequently using the primary edge interpolator, the secondary edge calculator, and the phase enable unit, and the phase overlay unit the synchronized clock signal is generated.

According to a further preferred embodiment of the present invention, the period of the generated clock signal is modulated in the spectral range to obtain a spread spectrum clock signal, wherein by using a spread spectrum interpolator after every clock signal cycle the generated period is caused to be incremented by a predetermined value, until an upper limit is achieved. Subsequently, the period is caused to be decremented by a predetermined value until a lower limit is achieved. This is repeated in cycles.

According to a further preferred embodiment of the present invention, the possibility is provided to generate an arbitrary clock (arbitrary clock synthesis). According to this more general approach an arbitrary number of clocks may be synthesized by the same multi-phase clock signal, wherein the waveform of the clock output may depend on an arbitrary number of synchronization signals. In this embodiment, a master clock counter is provided which is incremented in every master clock cycle, whereby a common time reference system is formed. By using this reference time stamps may be associated with every actual or also with every hypothetical event (e.g. rising or falling edge) in the overall clock generation system. To express the temporal position of the event between discrete master clock events, sections of almost unlimited accuracy may be used.

Time stamps are associated with rising edges and falling edges of the external synchronization events, are, however, also associated with edge positions of potentially complex and irregular clock signals. The abstract term "time stamp" allows the arithmetic processing of the events. Arbitrary clock shapes may thus be calculated and clock signals having a predetermined relationship to each other and to external events may easily be generated.

According to the invention, based on the clock signals provided in step (a) also a plurality of independent clock signals may be generated.

The present invention thus provides a system for the digital synthesis of different independent clock signals (DCS=digital clock synthesis). As a common basis for all synthesized clock signals multiple phases of a clock signal having a fixed frequency are used. According to the invention, the clock signals synthesized this way are substantially more stable than comparable clock signals which were obtained using a traditional, analog clock synthesis.

In contrast to the above-described conventional approaches, the inventive concept of the digital clock synthesis (DCS) allows the overlaying of the clocks to generate the desired clock pulses with a variable duty cycle. Instead of the conventional loop, according to the invention, the point of time of the sync event is measured and compared to an ideal sync event which is only present "virtually". According to the invention, the phase error in the virtual sync comparison is accurately determined quantitatively and the ideal clock is "calculated" and generated immediately.

The concept of universal time stamps which makes it possible to put events in relation to each other purely analytically within the whole system is missing in the prior art. The above-described approach having a conventional loop may therefore be omitted.

Further advantages of the present invention are in particular present in systems on a chip which use several clock domains. Apart from the that, the present invention also provides synchronized clock signals using the same approach, wherein in particular a clock for the sampling of analog signals with a programmable duty cycle and a programmable phase relation to a low-frequency synchronization signal may be generated.

According to a further advantage of the present invention, possible implementations of the technology are active in modular construction, wherein using a set of simple, standardized modules for the digital clock synthesis almost any application may be served, whereby a very high degree of reusability results.

The inventive digital clock synthesis offers a plurality of advantages over the traditional analog clock synthesis.

Improved clock jitter: according to the invention, a multi-phase clock having a fixed frequency with a very low jitter level may be generated, so that even with the additional jitter which is introduced by the phase granularity, the overall jitter is better than the one which may be achieved by a conventional multi frequency PLL, Improved clock accuracy: according to the present invention, up to the reference frequency, i.e. the frequency of the master clock signal, any target frequency may be generated, wherein the accuracy of the average frequency is only limited by the bit width of the used interpolators. In contrast, conventional, analog PLLs were limited to the discrete frequencies which were admitted by the PLL divider elements.

Reduced test effort: according to the invention, the amount of analog circuitry is reduced to a few, simple and standardized circuit blocks, and the circuit complexity is transferred to digital parts according to the invention, for which standardized and automated testing methods may be used, More synthesized clock signals per chip: as traditionally a practical limitation on the number of PLLs was given which were allowed per chip, according to the invention this limitation is eliminated now, as now the independent clock signals may be derived from one and the same PLL, Reduced silicon area: since the circuit complexity is shifted into the digital part of the circuit, in contrast to conventional approaches, advantage can be taken of the high density of logical circuits which may be obtained using sub-micron processes, Reduced pin count: analog PLLs require a dedicated number of external analog power supplies, whereas according to the invention the number of these power supplies may be reduced, as only one PLL having a fixed frequency is used for all independent clock signals, Reduced analog design effort: only a few relatively simple analog blocks need to be designed and may be reused for any chip in the same technology, Better simulation/emulation coverage: since a larger portion of the circuit construction moves to the digital design domain, using a digital simulation and emulation a high percentage of the system may be covered, and Design flexibility of the circuit: the synthesis of a certain clock signal may be designed very flexible in hardware and later exact clock properties for an optimal performance or for avoiding errors may be adjusted.

A further advantage of the digital clock signal synthesis is, that with every improvement or with every new digital technology an improved performance and an improved accuracy is obtained by the digital clock signal synthesis. The main parameter in the digital clock signal synthesis is to improve the phase accuracy of the multi-phase clock signal.

After all clock signal parameters in the digital domain are manipulated, it is thus active to adjust a clock signal to fixed requirements in a very flexible way. Many new applications will take advantages from this property, for example the precise delaying of signals by clocking with a shiftable clock in the phase.

Further, it is also possible to generate clock signals having higher frequencies than the master clock signal using a multi-phase clock signal having a short clock cycle, as based on the primary edges additional clock edges having the same cycle maybe calculated in a simple way. Shorter multi-phase clock signals may be derived by a logic combination of two phases. The shortest possible high period of the multi-phase clock signal is twice the phase accuracy.

BRIEF DESCRIPTION OF THE DRAWINGS

These and other objects and features of the present invention will become clear from the following description taken in conjunction with the accompanying drawings, in which:

FIG. 5a is the waveform of the delay for the enable signal for the phase overlay unit according to FIG. 3;

FIG. 5b is an example for a delay unit to generate the waveform in FIG. 5a;

DESCRIPTION OF THE PREFERRED EMBODIMENTS

Figure 1:
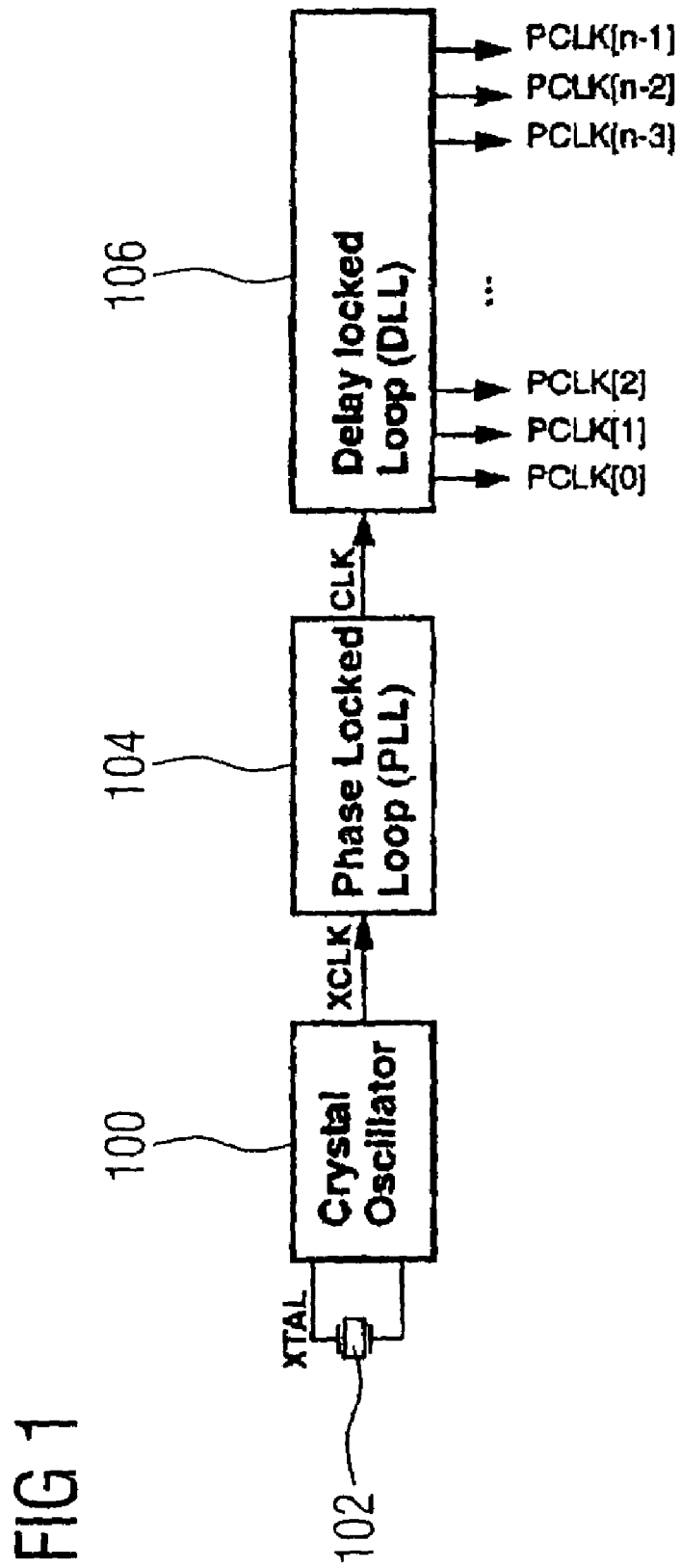
FIG. 1 is a multi-phase clock oscillator.

In the following, preferred embodiments are described in more detail with reference to the accompanying drawings, wherein in the description of the individual drawings similar or like elements are designated with the same reference numerals.

FIG. 1 shows an example for a multi-phase clock oscillator, which includes a crystal oscillator 100 which is coupled to an oscillating crystal 102 in order to output an oscillator clock signal XCLK. The oscillator clock signal XCLK is received by a phase locked loop (PLL) 104, which generates a master clock signal CLK based on the received oscillator clock signal, which is provided to the delay locked loop (DLL). The DLL 106 generates a plurality of clock signals PCLK[0] ... PCKL[n−1] on the basis of the applied master clock signal CLK. The generated clock signals all have the same frequency, comprise however respectively different phase relations in contrast to the master clock signal CLK and thus also comprise different phase relations to each other.

The digital clock signal synthesis (DCS) uses the master control signals CLK from which using the DLL 106 the clock signals PCLK[n−1:0] having $2^{n-1}$ phases are derived. Apart from the approach described using FIG. 1 such a multi-phase clock may also be generated using other technologies, including the conventional approach and the PLL+DLL approach shown in FIG. 1.

Figure 2:
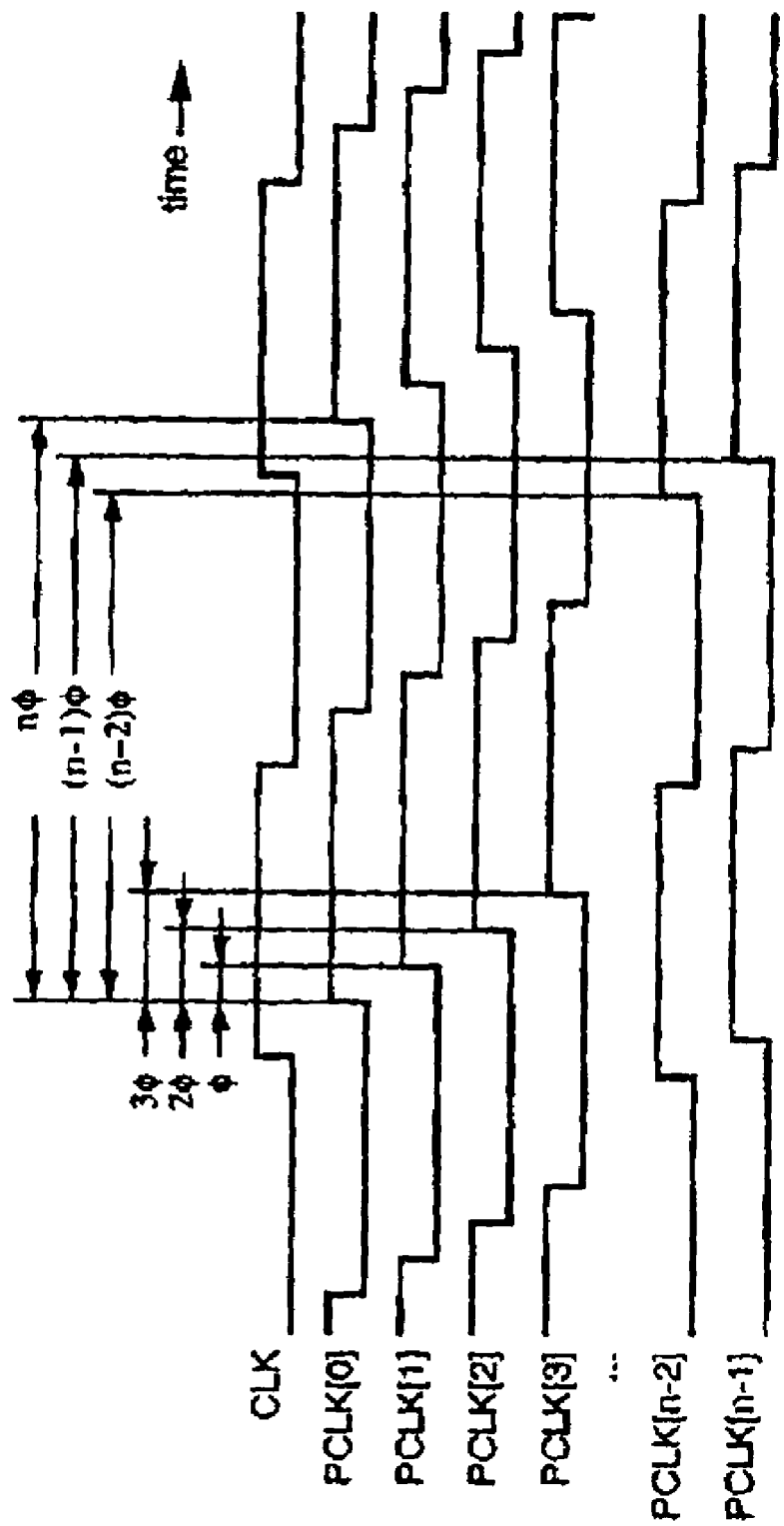
FIG. 2 is the waveform of the plurality of multi-phase control signals.

In FIG. 2 the waveform of the individual clock signal PCLK and of the master clock signal CLK is indicated over time. Further, the phase shifts existing between the individual clock signals PCLK[0] to PCLK[n−1] are illustrated. As it may be seen from FIG. 2, in the embodiment illustrated there the phase shift between successive clock signals is always the same Φ, so that for example between a rising clock edge of the first clock signal PCLK [0] and the first rising edge of the subsequent clock signal PCLK [1] a phase difference of Φ exists. The phase difference between two successive rising edges of a clock signal is always n×Φ.

The possible accuracy of all synthesized clock signals mainly depends on the phase resolution Φ of these multiphase clock signals PCLK. The maximum possible "phase resolution" is a function of the gate delay times, wherein for higher frequencies less delay tabs may be used, and vice versa. For Φ the following calculation specification holds true:

$$\phi = \frac{T_{CLK}}{n} = \frac{1}{n \cdot f_{CLK}}$$

wherein
Φ=phase resolution,
$T_{CLK}$=period of the master clock signal,
$f_{CLK}$=frequency of the master clock signal, and
n=0, 1, 2, . . .

It is desired to hold the master clock signal CLK at a fixed frequency or at least in a narrower ranger to thus give the possibility to optimize the used PLL circuit 104 and the used DLL circuit 106 for a maximum stability. After only one clock signal having a fixed frequency is used to generate all clock signals for a system, all efforts may be directed to make this one single clock as stable as possible, for example by suitable filters, separated power terminals, optimum arrangement on a chip, etc. All clock signals generated from this then also show the stability of this central source.

In the following table examples for master clock signals are given as well as examples for the number of used phases n, depending on the minimum structure sizes given by semiconductor technology in which the corresponding DLL and PLL circuits are manufactured.

| Technology | Max. Frequency $f_{CLK}$ | Number of Phases n | Phase Resolution Φ |
|---|---|---|---|
| 0.25 μm | 166 MHz | 32 | 188 ps |
| 0.18 μm | 250 MHz | 32 | 125 ps |
|  | 500 MHz | 16 | 125 ps |

In the following, a first preferred embodiment of the present invention is discussed in more detail, using which independent clock signals are synthesized based on the generated clock signals, as they were described above.

Figure 3:
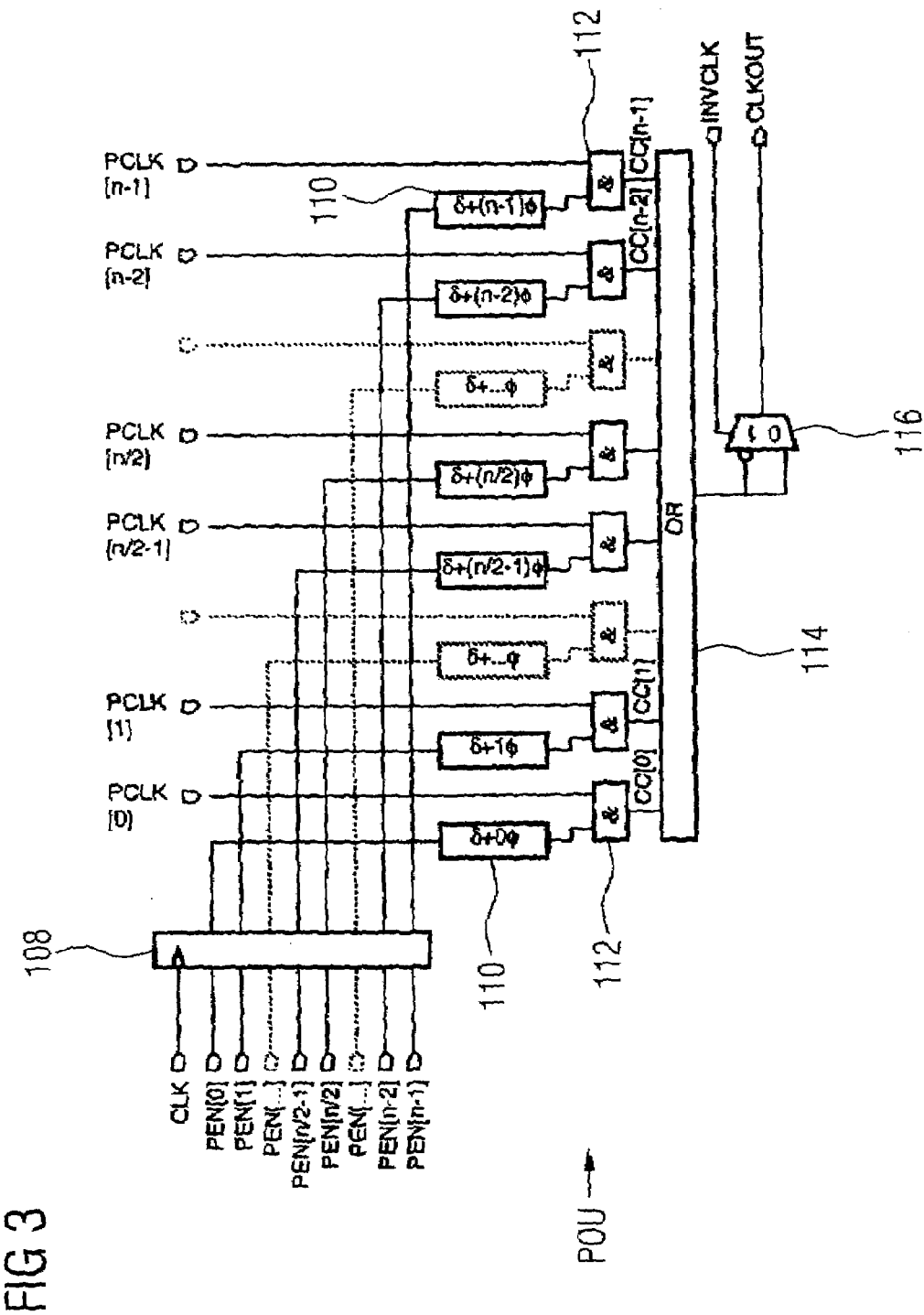
FIG. 3 is a phase overlay unit according to an embodiment of the invention.

In FIG. 3 an embodiment of an inventive phase overlay unit (POU) is shown. The phase overlay unit receives the clock signals PCLK[0] to PCLK[n−1] at its input through the DLL circuit 106. Further, the same phase overlay unit receives the master clock signal CLK and a control signal, here in the form of a plurality of enable signals PEN[0] to PEN[n−1] (PEN=phase enable). The enable signals PEN[ ] are provided to an input buffer 108 through which the same are clocked using the master clock signal CLK. A phase overlay unit further includes a plurality of delay elements 110, wherein the number of the delay elements 110 corresponds to the number of applied enable signals PEN[ ]. An enable signal is respectively provided to a delay element 110, and there the delay signal is delayed with a set delay Δ to which additionally a delay based on the phase shift is added. The respectively added phase delay results from the delay elements 110 shown in FIG. 3. Further, a plurality of AND gates 112 is provided, wherein each of the AND gates 112 receives an output signal of a delay element 110, i.e. a delayed enable signal PEN[ ] and a clock signal PCLK[ ], and subjects the same to a logical AND link. At the output of the AND gates 112 the output signals CC[0] to CC[n−1] are applied. These output signals are supplied to an OR gate 114, whose output signal is supplied to a multiplexer 116 once in a non-inverted form and again in an inverted form. The multiplexer 116 is controlled and outputs the non-inverted clock signal CLKOUT in the conventional control mode. If the multiplexer 116 is controlled using the control signal INVCLK, this means that an inverted clock signal is desired, so that in this case the inverted output of the OR gate 114 is output as the clock output signal CLKOUT.

The inventive digital clock signal synthesis thus overlays the several phases of the master clock signal over each other to form or built up, respectively, the clock to be generated. This is achieved by the above-described simple AND/OR circuit. For each clock signal phase PCLK[ ] an individual enable signal PEN[ ] is provided. All elementary pulses having a high logic level of the multi-phase clock signal which are active are linked using the OR gate in order to generate longer pulses having a high logic level. Basically, the first active enable signal determines the positive edge of the output signal CLKOUT, and the first non-active enable signal determines its negative edge. After the periods having a high logic level of the clock signal phases are temporally shifted their enable signals need to be aligned to guarantee sufficient setup hold times. This is achieved by the fact that additionally also the enable signals are delayed, wherein here different possibilities for the implementation of this delay exist, wherein later a preferred implementation will be explained in more detail.

The shortest pulse with a high logic level which may be generated using the circuit shown in FIG. 3, will have a duration of the elementary clock pulse. Pulses having a low logic level may be narrower and are only limited by the phase resolution. As far as narrower pulses with a high logic level are desired, the above-described clock signal inversion may be selected.

Figure 4:
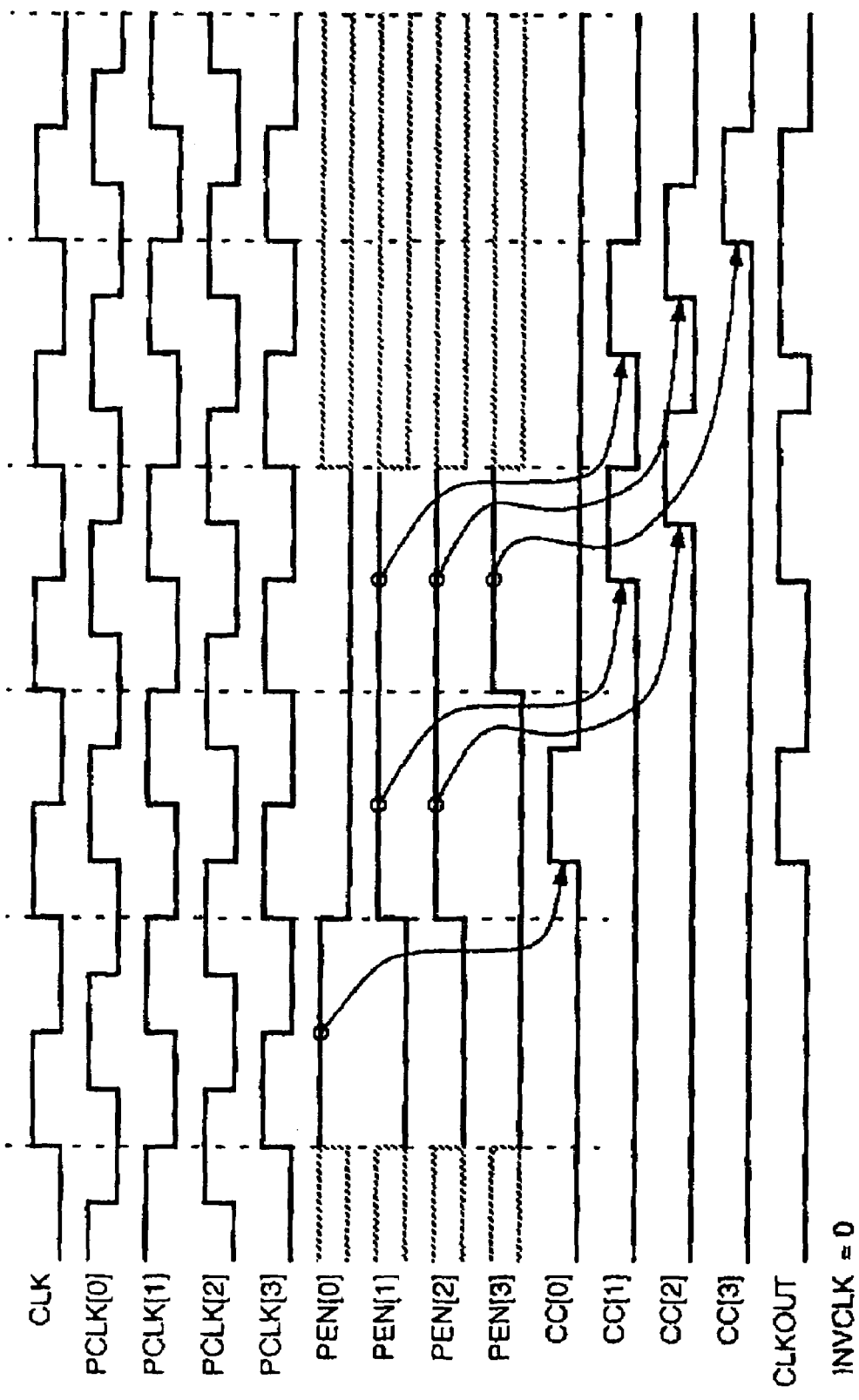
FIG. 4 is the waveform of the signals in the phase overlay unit according to FIG. 3.

In FIG. 4 an example of a clock overlay for four clock signals having different phases PCLK[0] to PCLK[3] is shown, wherein by the control of the corresponding enable signals PEN[0] to PEN[3] the synthesis of a non-periodic clock signal is illustrated. The enable pattern determined by the enable signals PEN[ ] controls the length of the individual periods having a high logic level and the periods having a low logic level and forms the pulse trains which are not periodic in the illustrated case, as mentioned above. In FIG. 4 further the outputs signals CC[0] to CC[3] of the AND gate 112 are presented. Further, the output of the OR gate 114 CLKOUT is illustrated, and INVCLK is selected to be 0. From the waveform of the output clock signal CLKOUT it may be seen that based on the pattern of the enable signals, as they are provided, in the output clock signal the period having a high logic level and the periods having a low logic level respectively comprise a different length and that the output signal is also not periodic.

In the following, using FIG. 5 an example for the delay of the enable signals is explained in more detail, wherein in FIG. 5a the signal waveforms of the signals, as they are used in FIG. 5b, are illustrated. FIG. 5 is an example which uses the anyway present delay elements in the phase overlay unit and in the DLL 106, so that in FIG. 5b the corresponding elements are designated with corresponding reference numerals. In fact, FIG. 5b is an enlarged illustration of a section of FIG. 3, which may easily be seen. In FIG. 5b the delay times occurring in the individual elements are illustrated.

Usually, the DLL circuit 106 generating the multi-phase clock signal is already realized using delay-controlled buffers. The signal which controls the delay of the DLL buffer chain elements may again be used to replicate all delays for the enable signals. The individual delays may be dimensioned according to the following calculation formula:

$$t_{DEL}(a) = \delta + a \cdot \phi = t_{C2P}(a) - t_{C2Q} - t_{SU}$$

$$t_{C2P}(a) = t_{C2P}(0) + a \cdot \phi$$

$$\delta = t_{C2P}(0) - t_{C2Q} - t_{SU}$$

$$t_{HOLD} = t_{CLK} - t_{DUTY} - t_{SU} = T_{CLK} - t_{DUTY} - t_{C2P}(0) + t_{C2Q} + \delta$$

Wherein:
$t_{DEL}(a)$=delay of the enable signal PEN[a],
$\Delta$=delay,
A=0, 1, 2, . . . n−1,
$\Phi$=phase,
$t_{c2P}(a)$ delay of the DLL 106,
$t_{c2Q}$=delay due to the input buffer 108
$t_{su}$=set-up time for the AND gate 112,
$t_{HOLD}$=hold-time for the AND gate 112,
$t_{DUTY}$=high period of the clock signal, and
$t_{CLK}$=period of the master clock signal The advantage of this analog delay mechanism is, that the circuit is to a great extent immune regarding changes of the clock signal of the master clock signal. It is not necessary for the delay reproduction to be very exact as the set and hold time ($t_{su}$, $t_{HOLD}$) for the AND gate 112 are small.

Alternatively to the above-described approach a latch mechanism may be provided which uses several of the clock signal phases. This purely digital approach has the disadvantage, however, that the multi-phase clock signal lines are loaded with a higher load capacity.

In the following, a second embodiment of the present invention is explained in more detail to generate a periodic clock signal which is almost arbitrarily programmable regarding frequency and clock cycle. With this clock signal interpolation a suitable sequence of enable signals is provided to synthesize the periodic signal with almost any frequency and any clock cycle up to the master clock signal speed. In order to generate the suitable enable pattern, first of all the position of the leading edges of the desired clock needs to be interpolated, for which the primary edge interpolator PEI is used, which is shown in more detail in FIG. 6.

The primary edge interpolator receives the signal PERIOD which indicates a period of the desired clock signal. Likewise, the interpolator receives the signal DUTY which indicates the clock cycle of the desired clock signal. The interpolator includes a plurality of latch memories 120 to 128 which are clocked using the master clock signal CLK and are formed by a D-flipflop.

The following table describes the symbols used in the description of the following Figures.

| Symbol | Description |
|---|---|
| PERIOD | Desired clock periods in units of the reference clock cycles for the generated signal CLKOUT |
| DUTY | Desired duty cycle for the generated clock signal CLKOUT |
| INIT | Initializes the phase interpolator; the interpolator is stopped and set to 0; directly after the output of the signal INIT a leading edge is output |
| EDGE | Flag indicating that in the current master clock signal cycle a primary edge should be generated |
| T_EDGE | Time to generate the primary edge |
| T_LEN | Length of the clock pulses with a high logic level |
| LEAD | Flag indicating that in the current master clock signal cycle a leading edge is to be generated |
| TRAIL | Flag indicating that in the current master clock signal cycle a trailing edge should be generated |
| P_LEAD | Position of the pulse which forms the leading edge within the current master clock cycle |
| P_TRAIL | Position of the pulse which forms the trailing edge within the current master clock cycle |
| i.k | Resolution of the timing parameters in multiple of the master clock signal cycles (integer-bits, fraction-bits) |
| i | Resolution for the master clock signal counter [bits] |
| N | Number of clock phases, powers of 2 |
| m | Resolution of the phase selector [bits], m = log$_2$ (n) |

Figure 6:
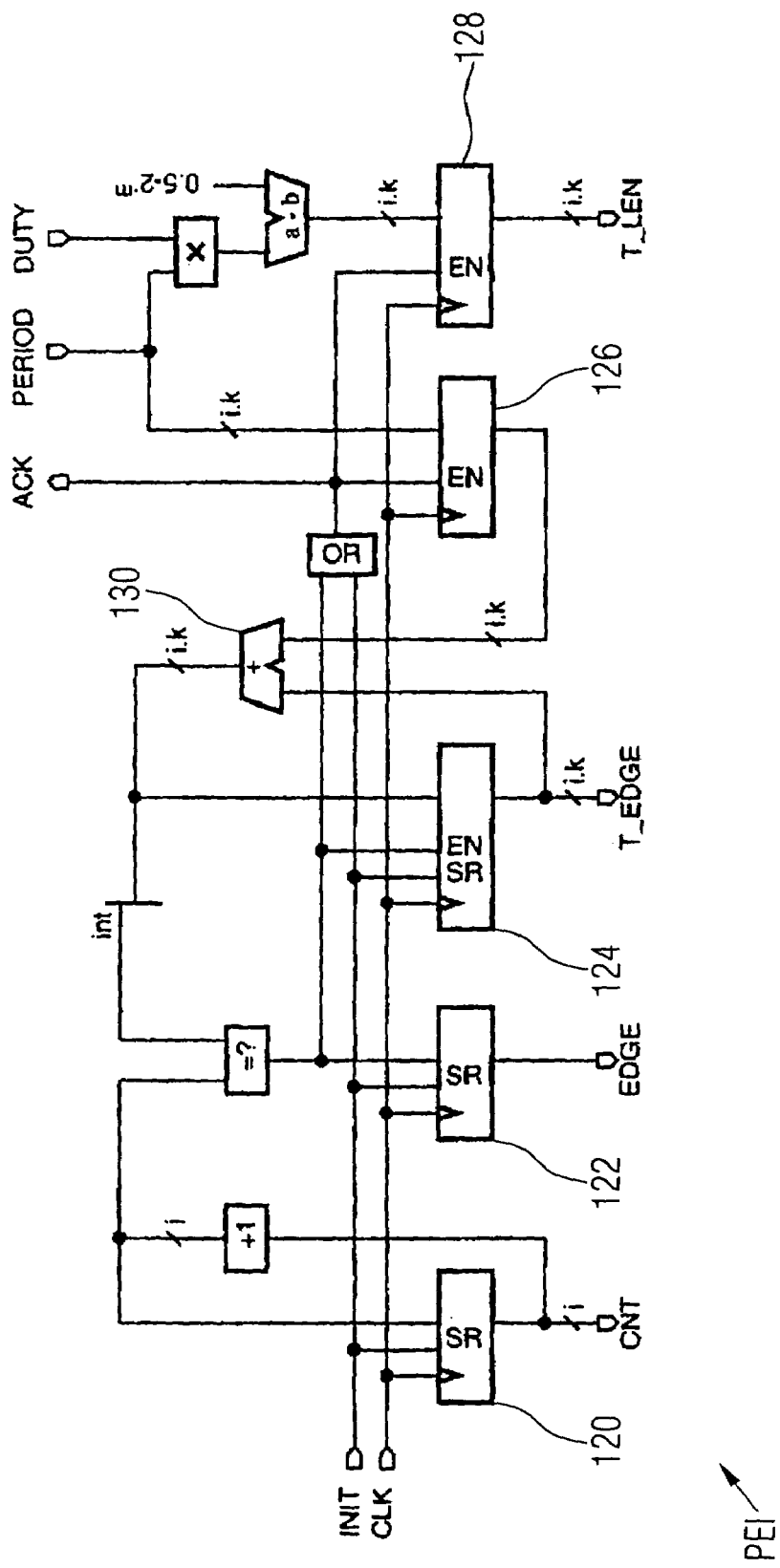
FIG. 6 is a primary edge interpolator for determining the leading edges in the clock signal.

In the following, the functionality of the primary edge interpolator of FIG. 6 is explained in more detail. CMC designates a free-running counter which is incremented by 1 in every master clock signal cycle. It provides a continuous time stamp for every master clock signal cycle. T_EDGE is the point of time according to the time stamp at which the next leading edge must occur. This point of time is interpolated by adding the clock period (PERIOD) to the previous leading edge, as it is shown by the adder 130 in FIG. 6. Whenever the next counter value and the next edge time stamp have equal integer bits, the next cycle must contain a leading edge. An active EDGE signal along with the edge generation time T_EDGE indicates this event that the next cycle must have a leading edge at the output. Only one leading edge for every master clock signal may occur with the circuit shown in FIG. 6. The signal PERIOD is buffered in the latch memory 126 with every leading edge to prevent side effects when this signal is changed during the cycle of the thus generated clock signal. Parallel to the clock signal period the duration of the desired clock signal pulse T_LEN, i.e. the time between the leading edge and the trailing edge, is calculated and provided at the output via the latch memory 128. This is a function of the clock cycle ranging from 0 to 1. It is also considered that even when the multi-phase clock is disabled the previous enable clock signal phase is still sustained for a certain time, the following holds true:

$$t_{sustain} = t_{master,high} - \phi$$

Wherein:
$t_{sustain}$=sustain time
$t_{master, high}$=time duration in which the master clock is at a high level,
$\Phi$=phase so the pulse duration of the generated clock calculated based on the clock cycle must be reduced by the sustain time.

According to the invention, the period of the desired clock signal and/or the duty cycle of the desired clock signal may be changed on the fly, wherein these changes take effect with the next synthesized clock signal cycle. The acceptance of the signal PERIOD and the signal DUTY are indicated using an acknowledgement signal ACK. With the initialization signal INT the generated clock may immediately be forced to 0. After the output of the signal INIT to the circuit in FIG. 6 a leading edge is output after a period according to the signal PERIOD.

Figure 7:
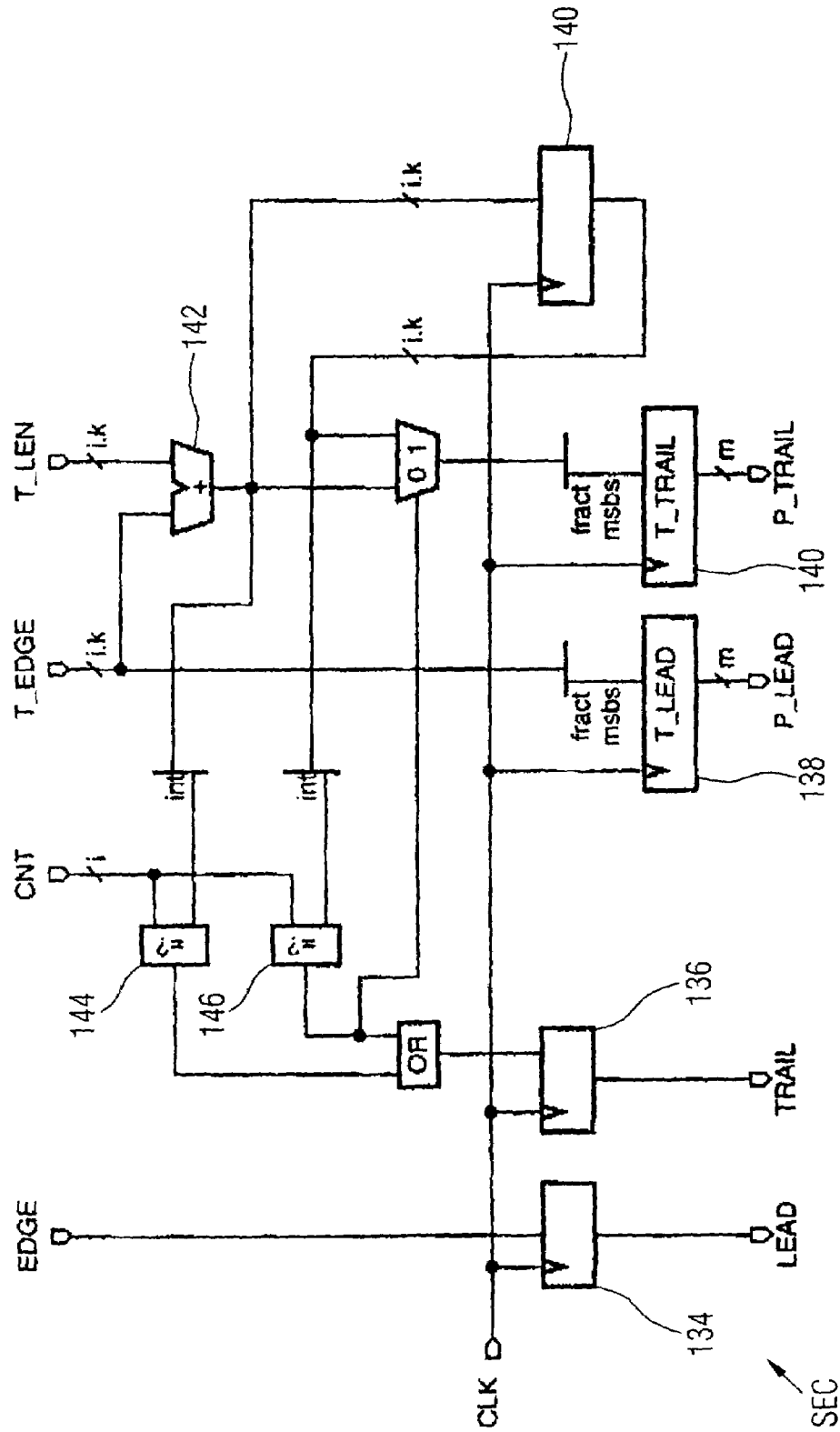
FIG. 7 is a secondary edge calculator for determining the trailing edges in the clock signal.

After the primary or the leading edge of the desired clock signal has been calculated, then the trailing/secondary edge needs to be calculated based on the leading/primary edge, which is performed using the secondary edge calculator SEC in the illustrated embodiment, whose preferred construction is illustrated in a detailed way in FIG. 7. As it may be seen, the SEC receives a plurality of input signals which were already explained in the table above. Additionally, the circuit includes a plurality of latch memories 134 to 140. A circuit according to FIG. 7 operates such that the desired pulse length is added to the point of time of the output of the edge by the interpolator in FIG. 6, as it is illustrated by the adder 142 in FIG. 7. If a secondary edge is still waiting to be output for the current master cycle, the new secondary edge time is delayed by one master cycle. This is not required in this master cycle as for each cycle only one secondary edge is admitted.

The signal indicating the generation of the leading edge LEAD and the position of the leading edges P_LEAD within the master clock cycle are latched in the latch memory 134 or 138, respectively. The signal TRAIL indicating the generation of the trailing edge is set as soon as the time stamp of the next master clock signal is equal to the integer portion of the calculated position of the trailing edge, as it is indicated by the comparison operations 144 and 146. This comparison must also be performed for the delayed version of a starting time (see comparator element 146) which receives the version latched in the memory 140, which is thus delayed. The positions of the edges within one cycle are described by the non-integer proportions of the calculated edge positions (sub-cycle position).

Figure 8:
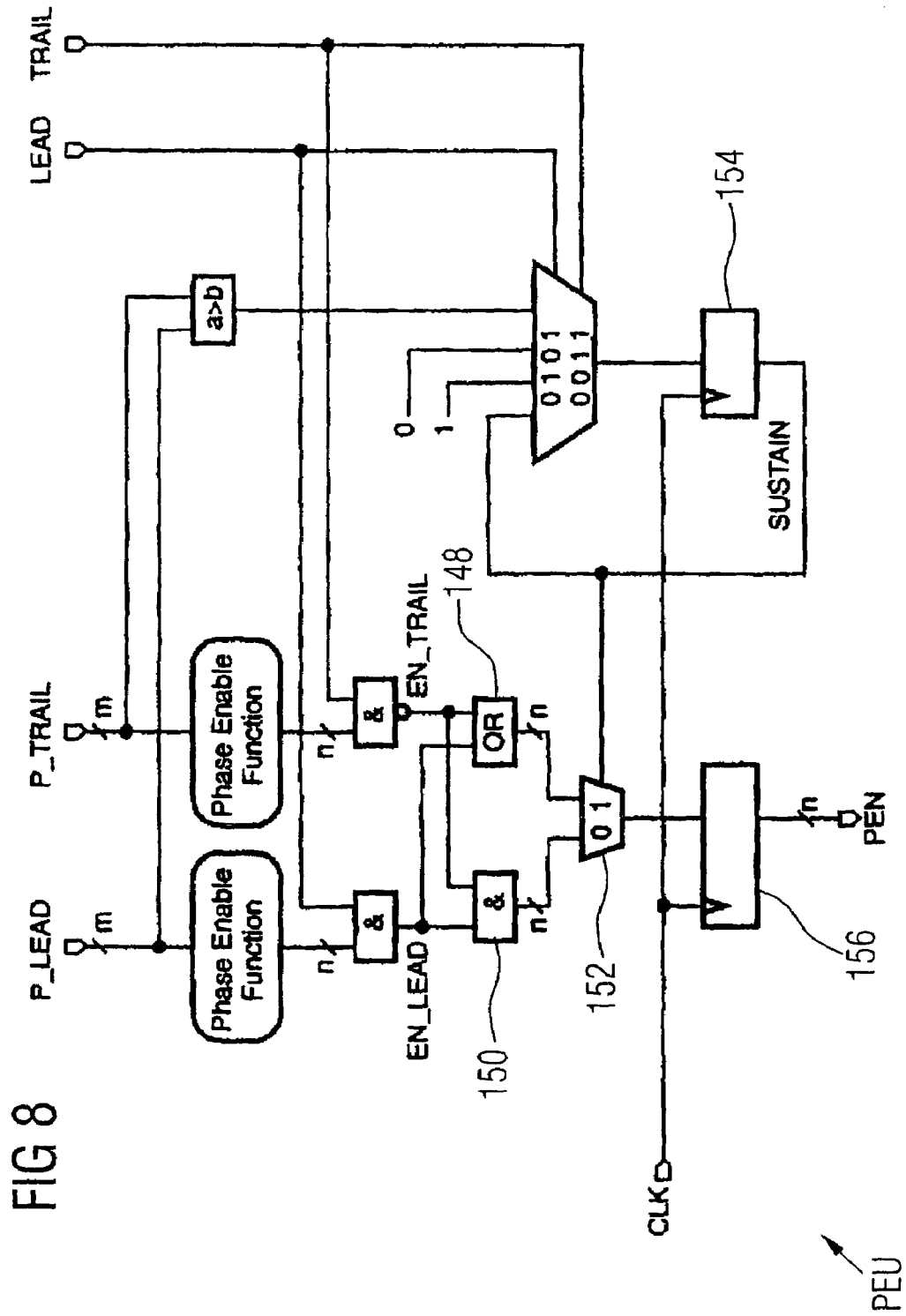
FIG. 8 is a phase enable unit for generating the enable signals.

After the edge positions and the generation flags have been provided in the above-described way, using the phase enable unit PEU shown in FIG. 8 the enable signal pattern required for the generation of the desired clock signal may be derived. The phase enable function shown in FIG. 8 generates the enable pattern only for one single edge and the enable pattern for an overall pulse results by overlaying two phase enable patterns, as it is shown in FIG. 8.

In the following table the phase enable function is illustrated again.

| P_LEAD P_TRAIL | Phase | EN [0: n − 1] | EN0: [n − 1] |
|---|---|---|---|
| 0 | 0 | $(1111\ldots 111)_2$ | $(0000\ldots 000)_2$ |
| 1 | Φ | $(0111\ldots 111)_2$ | $(1000\ldots 000)_2$ |
| 2 | 2Φ | $(0011\ldots 111)_2$ | $(1100\ldots 000)_2$ |
| . | . | . | . |
| . | . | . | . |
| . | . | . | . |
| n − 2 | (n − 2)Φ | $(0000\ldots 011)_2$ | $(1111\ldots 100)_2$ |
| n − 1 | [n − 1]Φ | $(0000\ldots 001)_2$ | $(1111\ldots 110)_2$ |

The edge generation flags activate the corresponding edge enable pattern, wherein the pattern is further inverted regarding the trailing edge. Depending on the signal SUSTAIN the two patterns are combined either using an OR function 148 or an AND function 150. The selection is performed using a multiplier 152 which is controlled by the signal SUSTAIN which is provided in the latch memory 154. The enable signal PEN is latched within the latch memory 156 and output under the control of master clock signal CLK.

Figure 9:
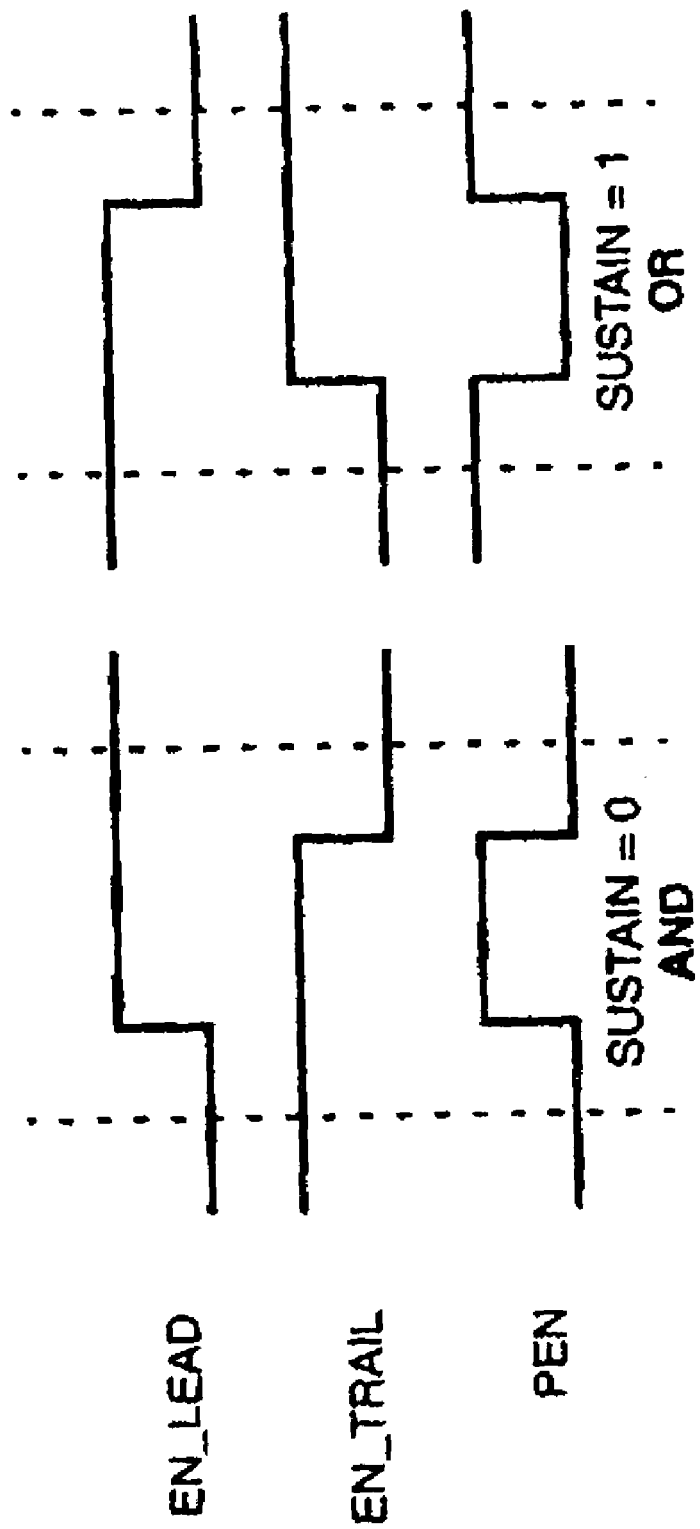
FIG. 9 is the waveform of a sustain signal.

The signal SUSTAIN is provided to store whether the last output edge was a leading edge or a trailing edge. The signal SUSTAIN is set by a single LEAD signal and is reset by a single TRAIL signal. When neither the signal LEAD nor the TRAIL are output, the signal SUSTAIN sustains its status as it may be seen from the waveform in FIG. 9. When both edges occur in one master clock cycle, their positions determine the value of the signal SUSTAIN. By the signal SUSTAIN it is thus guaranteed that in cycles in which no edge activity exists the correct clock signal polarity is sustained.

Figure 10:
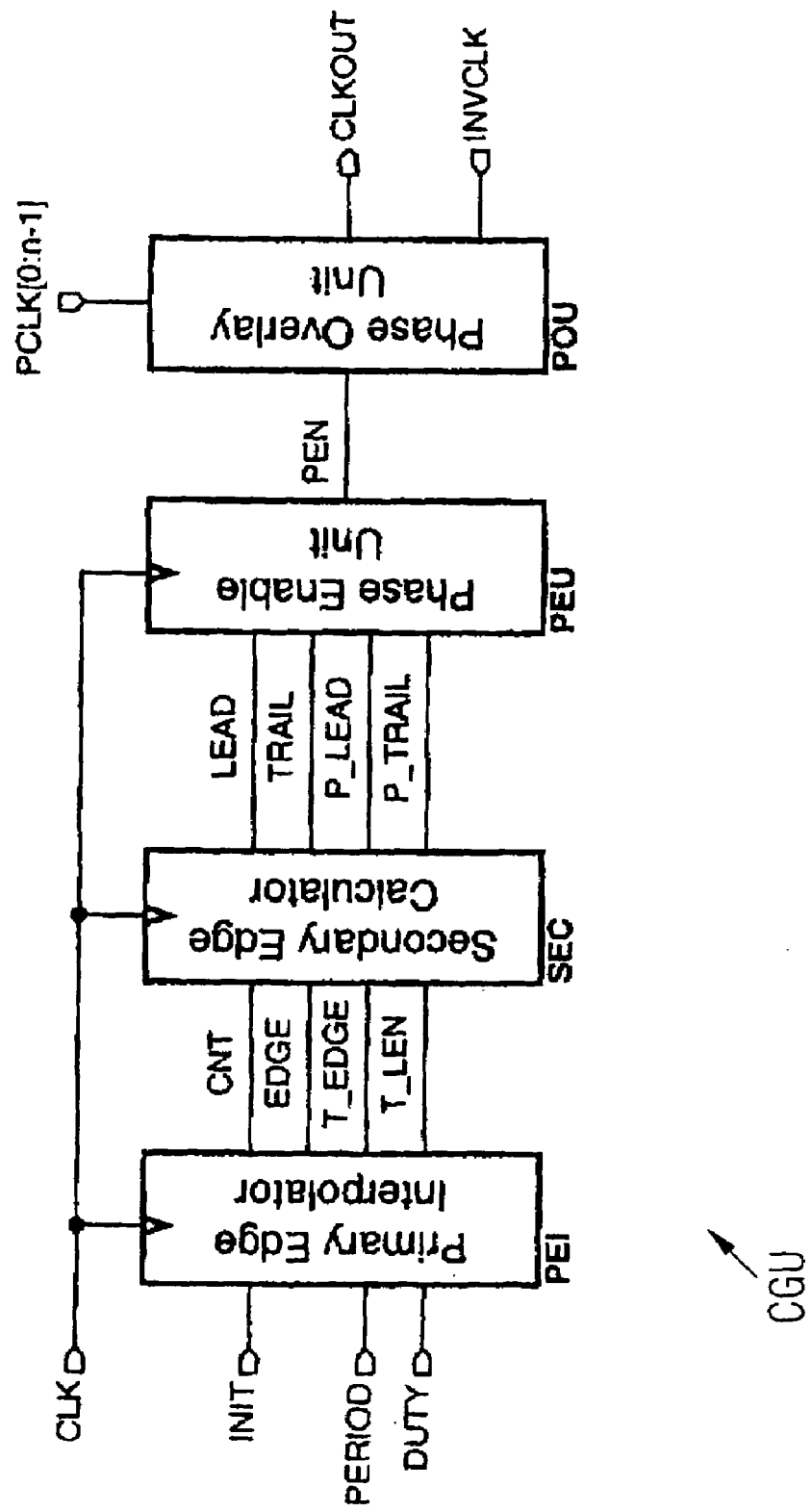
FIG. 10 is an example for a clock generation unit including the units from FIGS. 3, 6, 7 and 8.

In FIG. 10 a clock generation unit CGU is shown in which the individual modules described above are combined to generate a freely programmable free-running clock. The primary edge interpolator calculates successive positions of the leading clock edge and the pulse lengths of the clock signal having a high logic level. The secondary edge calculator derives the position of the trailing edge. The phase enable unit combines a phase enable pattern from this information and within the phase overlay unit the activated multi-cycle clock signals are logically combined with high logic pulses using an OR operation in order to thus generate the output signal CLKOUT which is the desired clock signal.

Figure 11:
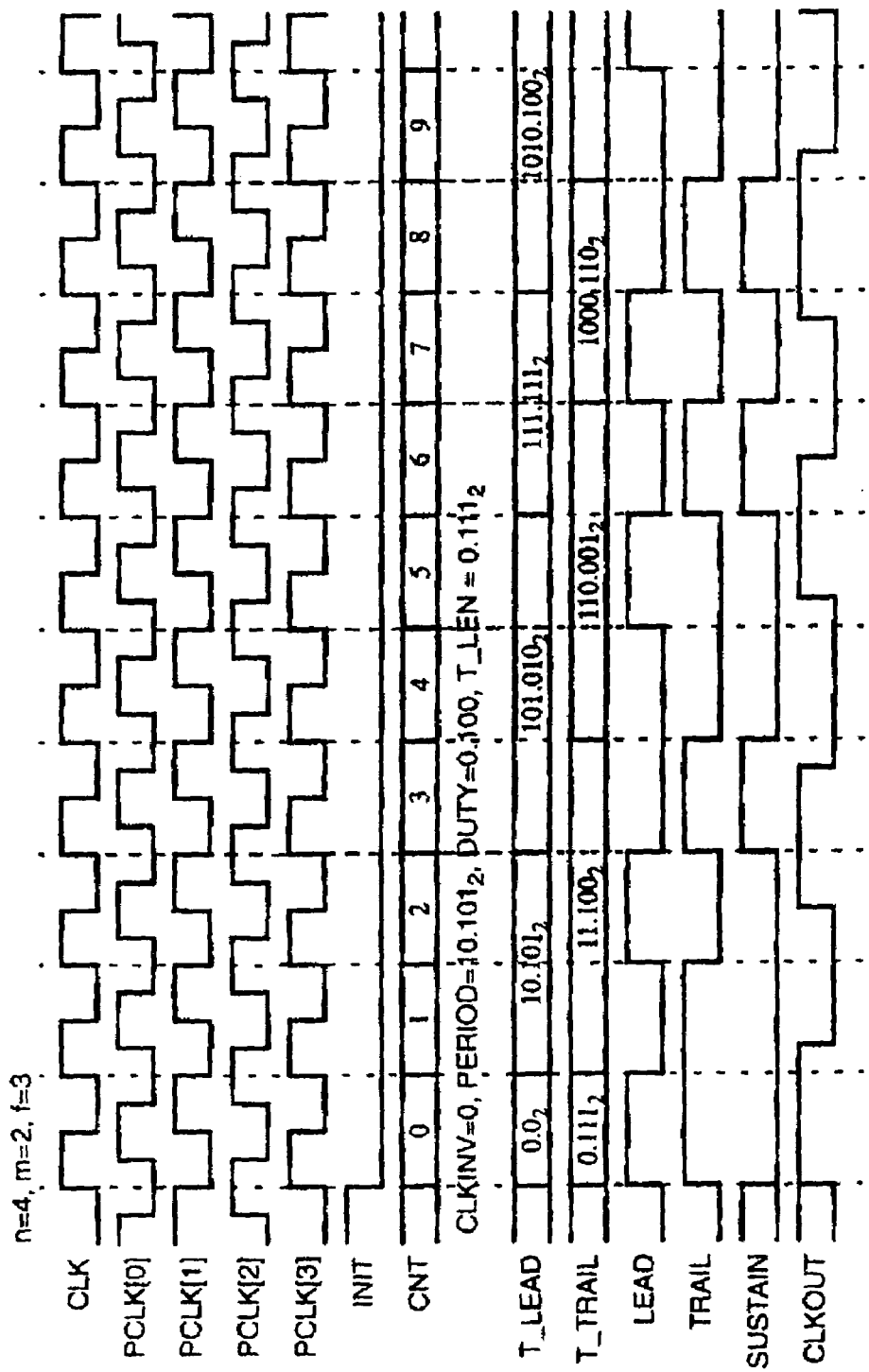
FIG. 11 is the waveform of the signals in the clock generation unit from FIG. 10.

FIG. 11 shows the waveform for a clock signal overlay using four phases PCLK[0] to PCLK[3], wherein in FIG. 11 the binary values for the signals PERIOD, DUTY and T_LEN are given. FIG. 11 shows an example for the clock signal synthesis using a multi-phase master clock signal having only four phases, wherein this was selected for reasons of clarity. It is noted that the fractional accuracy of the interpolator is higher than this would be required to differentiate between the four phases, which is however sensible as this increases the resolution of the average generated frequency. Phase positions which do not hit the phase grid are rounded off to the next lower phase.

Figure 12:
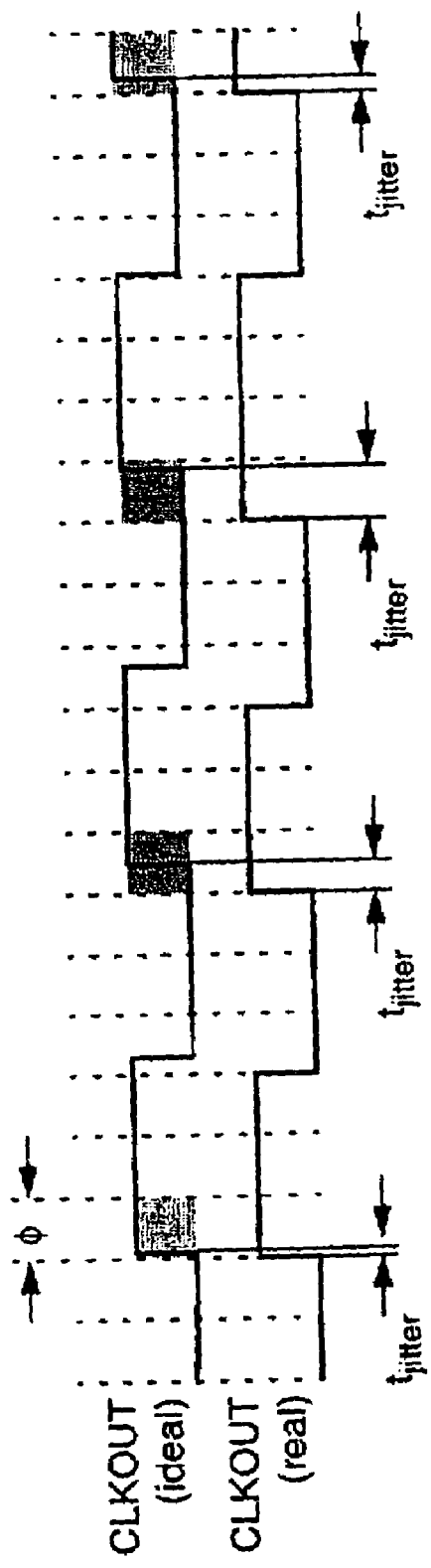
FIG. 12 is the clock jitter for a real clock signal.

Due to this rounding process which is performed due to the above-mentioned reasons, a systematic jitter is introduced as its results in FIG. 12 from the comparison of an ideal output signal to a real output signal. The amount from peak value to peak value of this jitter is equal to the phase resolution. This jitter is added to the intrinsic jitter of the multi-phase clock signal, so that:

$$t_{(jitter,CLKOUT)} = t_{(jitter,PCLK)} + \Phi$$

The width of the counter (i) for the master clock cycle is determined by the maximum clock cycle period which may be synthesized, wherein the maximum clock cycle period is calculated as follows:

$$t_{CLKOUT,MAX} = \frac{1}{f_{CLKOUT,MIN}} = \frac{2^i}{f_{CLK}}$$

The required counter accuracy i then results as follows:

$$i = \log_2\left(\frac{f_{CLK}}{f_{CLKOUT,MIN}}\right)$$

wherein $f_{CLK}$=frequency of the master clock cycle, and
$f_{CLKMIN}$=minimum frequency to be synthesized Due to the restricted interpolator resolution only discrete clock periods with a granularity $\Delta t_{CLKOUT}$ may be generated. $\Delta t$ is calculated as follows:

$$\Delta t_{CLKOUT} = \frac{1}{f_{CLK}} \cdot 2^{-k}$$

Frequencies may be generated using discrete steps of $\Delta f_{CLKOUT}$, wherein the steps for higher synthesized frequencies between possible values get larger so that:

$$\Delta f_{CLKOUT} = f_{CLKOUT}^2 \cdot \Delta t_{CLKOUT}$$

To determine the required faction resolution of the interpolator, the maximum frequency which is to be synthesized needs to be considered so that for the required faction resolution k of the interpolator the following is given:

$$k \geq \log_2\left(\frac{1}{f_{CLK} \cdot \Delta t_{CLKOUT,MIN}}\right) = \log_2\left(\frac{f_{CLKOUT,MAX}^2}{f_{CLK} \cdot \Delta f_{CLKOUT}}\right)$$

When the maximum frequency is equal to the master clock signal frequency, the equation for k may be simplified as follows:

$$k \geq \log_2\left(\frac{f_{CLK}}{\Delta f_{CLKOUT}}\right) \text{ for } f_{CLKOUT,MAX} = f_{CLK}$$

As an example a master clock having a frequency of 250 MHz with 32 phases is assumed. Based on this master clock a clock with a frequency range from 1.0 MHz to the master clock frequency is to be generated with an accuracy of 20 ppm. For this example the following is given:

$$i = \log_2\left(\frac{f_{CLK}}{f_{CLKOUT,MIN}}\right) = \left(\frac{250 \text{ MHz}}{1 \text{ MHz}}\right) \approx 7.97 \rightarrow i = 8$$

$$k \geq \log_2\left(\frac{f_{CLK}}{\Delta f_{CLKOUT}}\right) = \left(\frac{1}{0,00002}\right) \approx 15.61 \rightarrow k = 16$$

For this example the interpolator thus needs to comprise 8 integer bits and 16 fraction bits, i.e. an overall of 24 bits.

In the following, a further preferred embodiment of the present invention is described. With many applications it is desirable to generate a clock signal which comprises a defined phase relation and a defined frequency relation to a synchronization signal. One typical example for this is the sample clock for an analog video interface. In this situation, normally a horizontal synchronization signal is provided for every line. The pixel frequency is a defined integer multiple of this sample clock. The synchronization signal and the pixel clock are not necessarily in phase and the phase also needs to be settable by a user.

Figure 13:
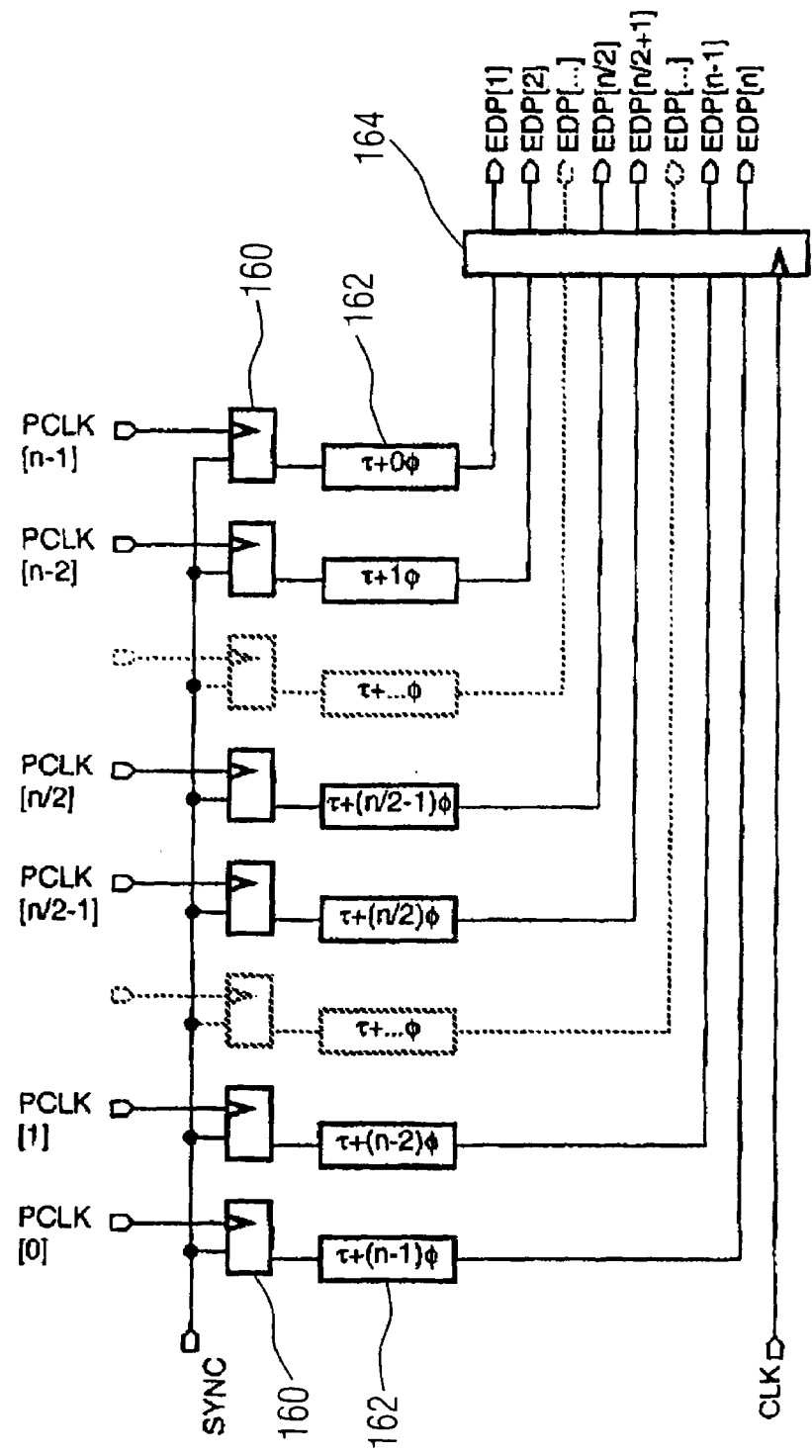
FIG. 13 is an edge detection unit to detect edges in a synchronization signal.

According to the described embodiment, first of all the edges within the synchronization signal need to be determined in order to obtain an edge pattern. For this an edge detection unit EDU is provided which is illustrated in FIG. 13 according to a preferred embodiment. The edge detection unit receives the synchronization signal SYNC which is supplied to a plurality of latch memories 160. Each latch memory 160 receives one of the clock signals PCLK[ ]. Similar to FIG. 3 also here delay elements 162 are provided which delay the signals output from the memories 160 according to a predetermined delay and pass them on to an output buffer 164 which further receives the master clock signal CLK. The output buffer 164 provides the signals EDP[ ] at its output. With the multi-phase clock signal it is simply possible to measure the temporal position of signal changes within the synchronization signal. For each master clock signal cycle the synchronization signal is latched with all clock signals in the memories 160 and the latched results are aligned in a temporal arrangement using the delay elements 162 which may for example be the same elements which were designated by 110 in FIG. 3.

Figure 14:
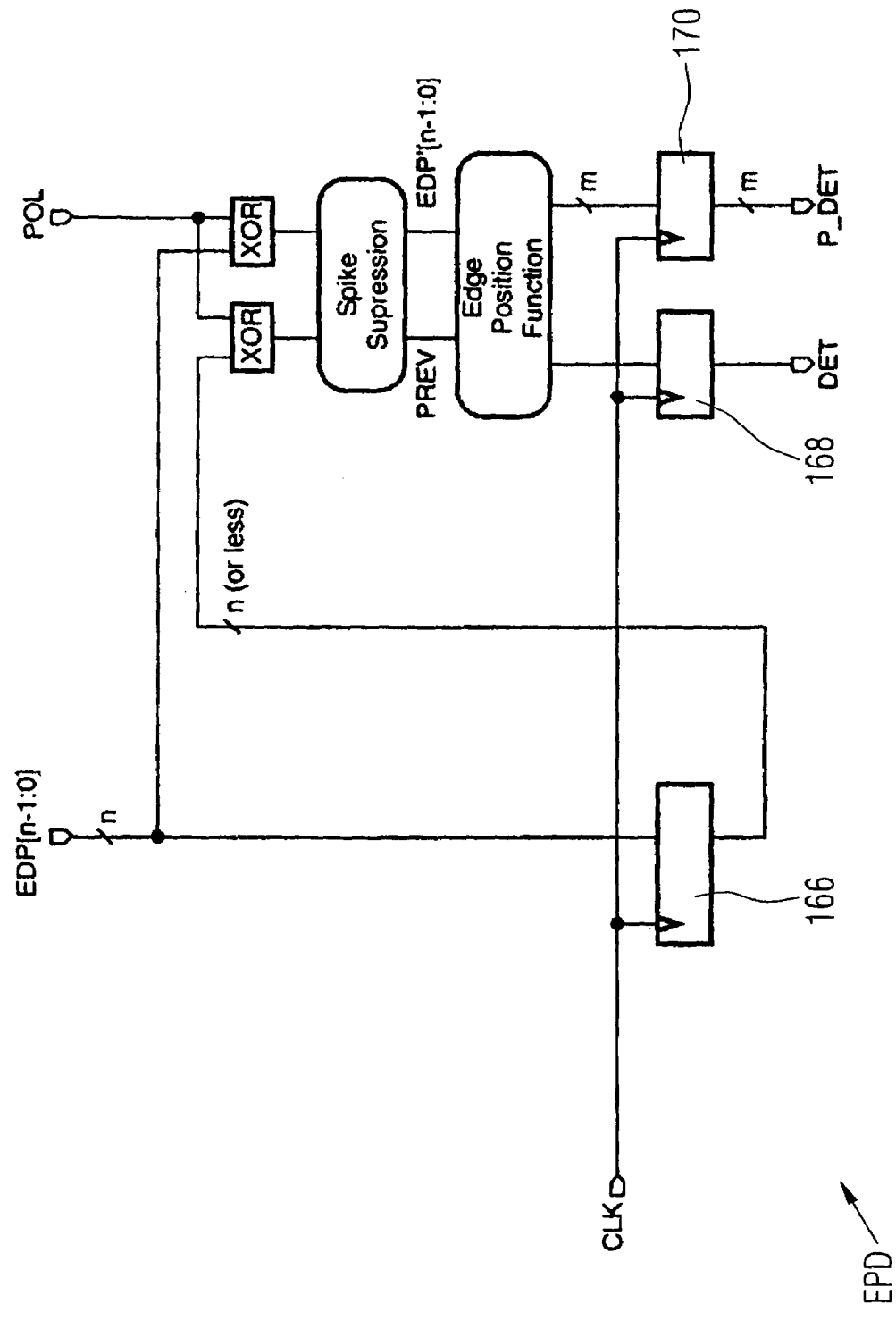
FIG. 14 is an edge position decoder to detect positions of the edges in the synchronization signal.

The latched pattern reflects the signal performance within the preceding master clock cycle using the provided phase resolution. This pattern, together with the freely running master clock signal counter enables to associate time stamps to the occurrence of signal changes. Using the edge position decoder EDP illustrated as an example in FIG. 14, the edge pattern generated by the edge detection unit EDU may be examined regarding an edge having a desired polarity POL. The edge position decoder on the one hand receives the edge pattern [ ] and on the other hand the signal POL indicating the polarity. The edge position function shown in FIG. 14 only searches for positive edges, however, using a simple inversion of the input pattern also negative edges may be searched for. The spike suppression suppresses temporary changes of the input signal as long as these remain below a predetermined threshold. This requires that the waveform of the signal in the preceding cycle is known, which is guaranteed by the register 166. Via the latches 168 and 170 the signals DET or P_DET are output, respectively.

In the following table an example for the edge position function is given.

| PREV | EDP[0: n − 1] | P_DET | DET |
|---|---|---|---|
| 0 | (1xxx ... xxx)$_2$ | 0 | 1 |
| x | (01xx ... xxx)$_2$ | 1 | 1 |
| x | (x01x ... xxx)$_2$ | 2 | 1 |
| x | ... | ... | 1 |
| x | (xxxx ... 01x)$_2$ ( | n − 2 | 1 |
| (xxxx ... x01)$_2$ | (0000 ... 001)$_2$ | n − 1 | 1 |
| others | | x | 0 |

Figure 15:
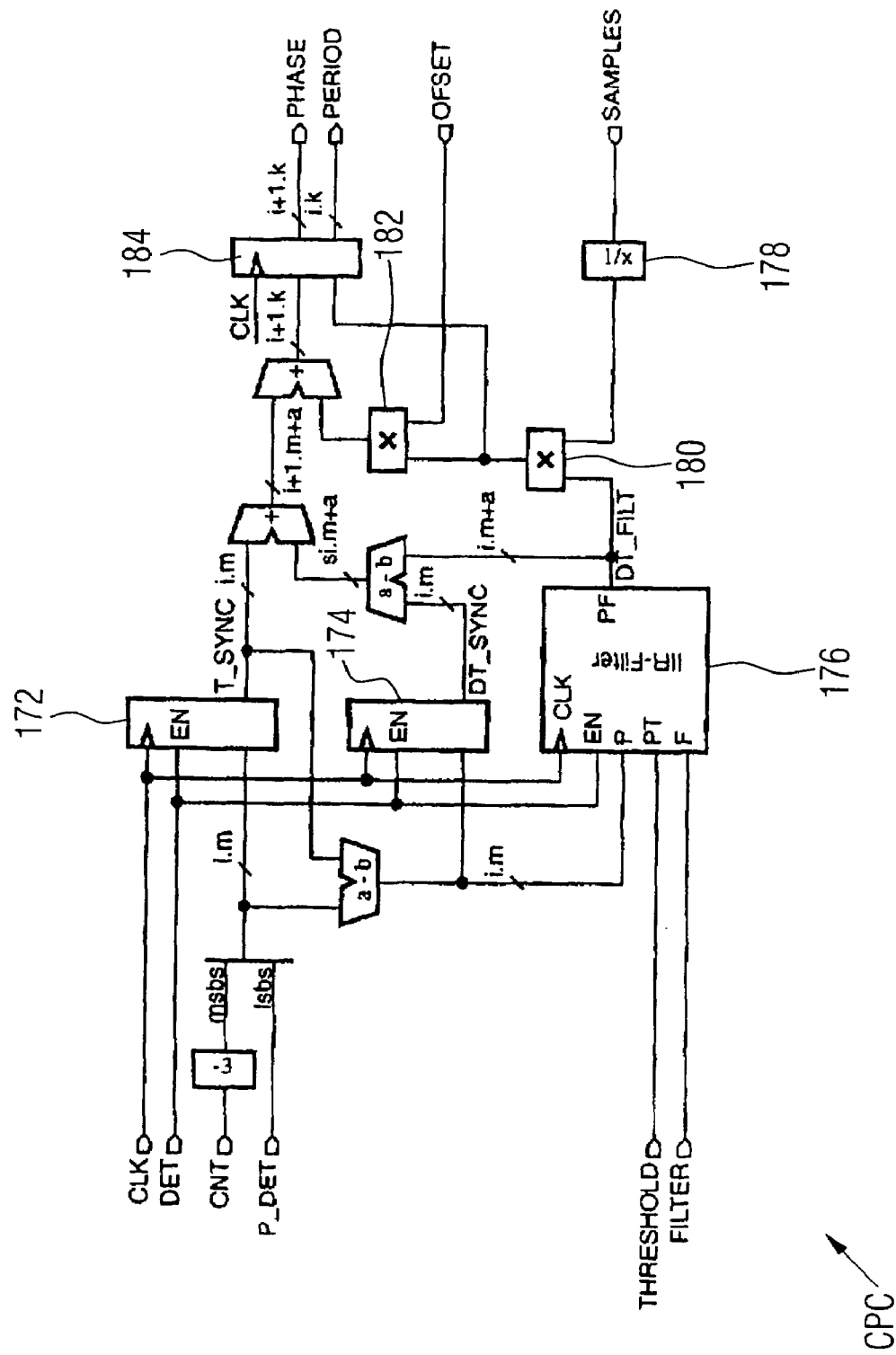
FIG. 15 is a clock parameter calculation unit.

As soon as the exact time stamps of the successive edges of the synchronization signal are known, the suitable parameters for the synchronous output clock may be calculated using the clock parameter calculator CPC illustrated in FIG. 15.

The measurement of the synchronization edge took place three cycles ago, so that the current count value must be corrected. The time stamp for the previous synchronization event is memorized as T_SYNC in the register 172. With every new synchronization event a difference between the time stamps, or in other words, the period of the synchronization signal, is calculated and stored as the signal DT_SYNC in the memory 174. Moreover the measured period is filtered using an infinite impulse response filter 176 in order to obtain the filter output signal DT_FILT. This reduces the sensitivity of the circuit to jitter in the synchronization signal.

The exact position of the synchronization event (T_SYNC) is corrected by the difference between the measured synchronization period and an ideal (filtered) synchronization period. The first clock signal shall be synthesized with a defined shift (signal OFSET) from the ideal (corrected) synchronization events time stamp.

The filtered synchronization period (signal DT_FILT) is also used to determine the period of the clock signal (signal PERIOD) to be synthesized. This is effectively achieved by the fact that the synchronization period is divided by the number of synthesized clock signals which occur between successive synchronization events (signal SAMPLES), as it is shown by blocks 178 and 180 in FIG. 15.

With reference to the circuit of the clock signal parameter calculator illustrated in FIG. 15 it is to be noted that it is not optimized for high master clock signal speeds. In particular, the two multipliers 180 and 182 cause a significant delay. The output flip-flop 184 may, however, latch their results in a later cycle or they can be pipelined. In applications in which the synchronization period only modestly changes the signal DT_FILT of the previous measurement may be used to gain more time for the calculation. The reciprocal number of samples (signal SAMPLES) may be pre-calculated in software.

Figure 16:
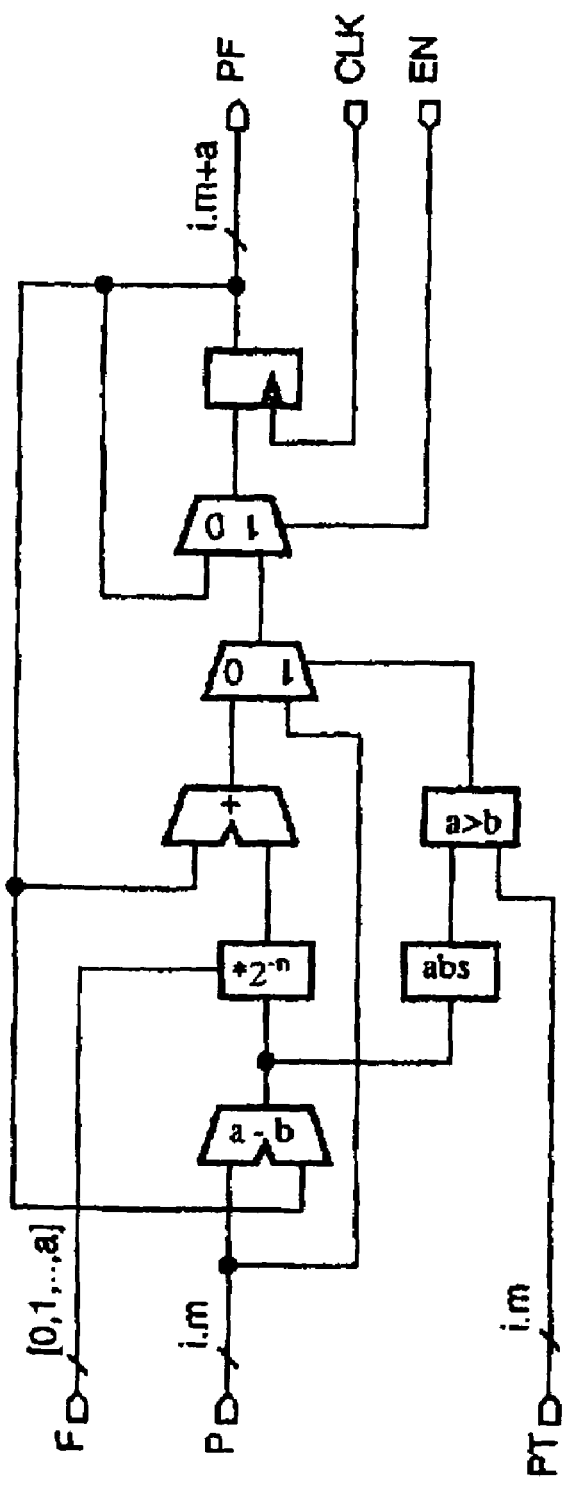
FIG. 16 is an IIR filter.

The filter 176 for the synchronization period may be implemented in different forms which exploit the course of period measurements. The type of filter needed depends very much on the application and the stability of the incoming synchronization signal. FIG. 16 shows an example for an IIR filter 176 which illustrates a simple implementation of the filter which performs a weighted addition of the filtered measurement and the current measurement according to the following equation:

$$PF_{n+1} = \begin{cases} \dfrac{P + (2^F - 1)PF_n}{2^F} & \text{if } |P - PF_n| \leq PT \\ P & \text{if } |P - PF_n| > PT \end{cases}$$

If the measured period changes by more than a programmable threshold THRESHOLD, the filter 176 takes effect immediately, so that as a result the jitter may be suppressed and frequency changes are followed without delay.

According to the embodiment described herein, instead of the primary edge interpolator described using FIG. 6 a new primary edge interpolator PEI2 for the clock signal synchronization is used now. The circuit generates always a primary edge at the time of the reception of the time stamp PHASE and then switches to the new clock signal period. Before this time stamp is received, the preceding clock signal period is active. Further, successive clock edges are compared to the value of the signal PHASE. To prevent the insertion of a shorter clock period directly before the reception of the time stamp PHASE such edges are left out. It is to be noted that this synchronizable phase edge interpolator generates a clock signal with a fixed duty cycle of 50%.

Figure 17:
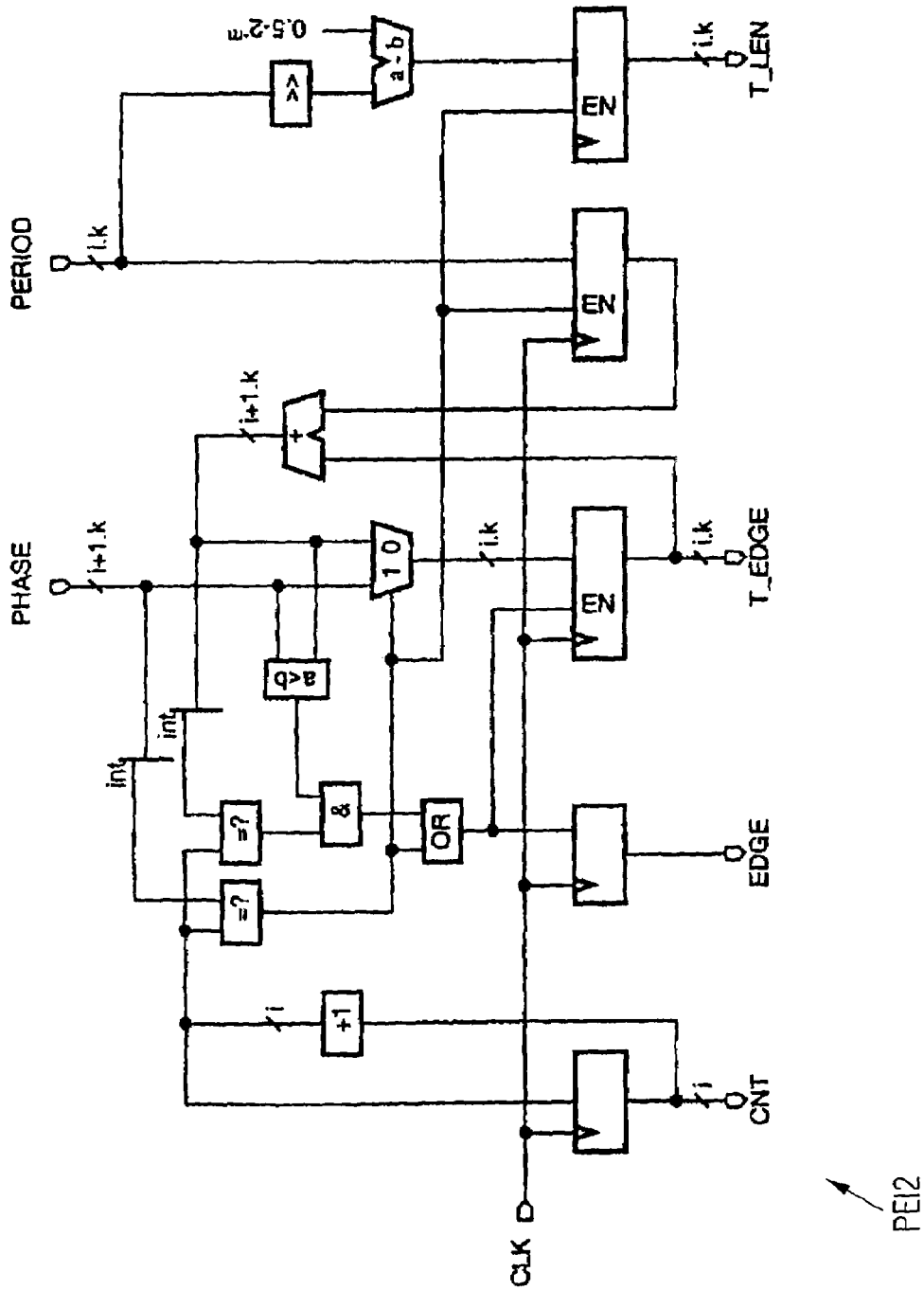
FIG. 17 is a primary edge interpolator according to a second embodiment.

As it may be seen from a comparison to FIGS. 17 and 6, by the new interpolator the same output signals are generated as with the interpolator from FIG. 6, which are subsequently provided to the already above-described units SEC, PEU and POU for the generation of the clock signal CLKOUT.

Figure 18:
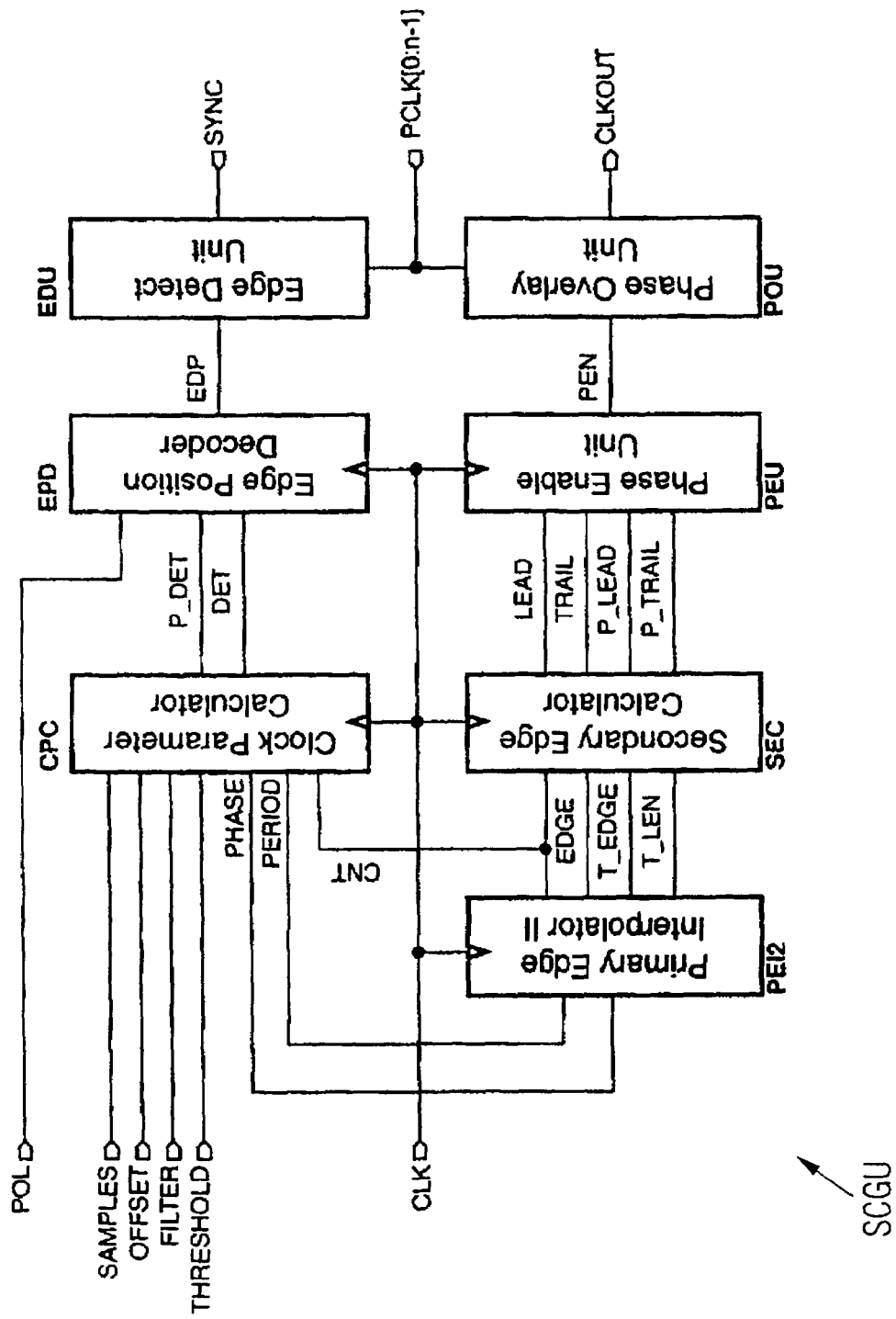
FIG. 18 is a synchronous clock generation unit for generating a synchronous clock signal which includes the unit from FIGS. 3, 7, 8, 13, 14, 15 and 17.

In FIG. 18 an example for a synchronous clock signal generation unit SCGU according to the above-described embodiment is illustrated. The elements described in the preceding FIGS. are summarized to the overall unit SCGU, wherein in FIG. 18 received and output signals of these respective elements or units, respectively, are illustrated. The above-described blocks or units are combined with the digital synchronous clock generator illustrated in FIG. 18. A synchronization edge is detected and a time stamp is assigned to the synchronization event. Subsequently, the period between the synchronization events is calculated. With this information the parameters for the clock to be synthesized may be determined. Knowing these parameters the above-described circuit for the free-running clock generator may be used, with a slight change regarding the use of the primary edge interpolator.

In some applications it may additionally be required to reconstruct an ideal synchronization signal which is perfectly aligned with the synthesized clock signals and without jitter. This can be achieved by the use of a further phase overlay unit along with some digital processing. Using the synchronization time stamp, its period and sample offset, a synthetic synchronization signal may be generated just as another clock.

Every time stamp between two synchronization events has to be unique, so that the integer accuracy of the interpolator is determined by the minimum synchronization frequency.

$$i \geq \log_2\left(\frac{f_{CLK}}{f_{CLKOUT,MIN}}\right)$$

Between two synchronization events the synchronization clock is free running and experiences a phase error (Δt), which is a function of the number of interpolated clock periods and the fraction resolution of the interpolator.

$$\Delta t = \frac{f_{CLK,MAX}}{2^k \cdot f_{CLK} \cdot f_{SYNC,MIN}}$$

The fraction interpolation accuracy can be determined as follows:

$$k \geq \log_2\left(\frac{f_{CLKOUT,MAX}}{\Delta t \cdot f_{CLK} \cdot \Delta f_{SYNC,MAX}}\right) \quad \text{für } \Delta t = \Phi$$

$$k \geq \log_2\left(\frac{f_{CLKOUT,MAX}}{\Delta t \cdot f_{CLK} \cdot \Delta f_{SYNC,MAX}}\right) + m$$

As an example a graphics application is considered. Here, a pixel sample clock (ACKL, 25 . . . 210 MHz) is to be generated from a horizontal synchronization signal (HSYNC, 15 . . . 115 kHz), wherein a master clock with 250 MHz and 32 phases is used. The following is true:

$$i \geq \log_2\left(\frac{f_{CLK}}{f_{CLKOUT,MIN}}\right) = \log_2\left(\frac{250 \text{ MHz}}{0.015 \text{ MHz}}\right) \approx 14{,}02 \rightarrow i = 15$$

-continued $$k \geq \log_2\left(\frac{f_{CLKOUT,MAX}}{\Delta t \cdot f_{CLK} \cdot \Delta f_{SYNC,MAX}}\right) + m =$$

$$\log_2\left(\frac{210 \text{ MHz}}{0.015 \text{ MHz}}\right) + 5 \approx 18.77 \rightarrow k = 19$$

The edge interpolator thus has to include 15 integer bits and 19 fraction bits, i.e. an overall of 34 bits.

Figure 19:
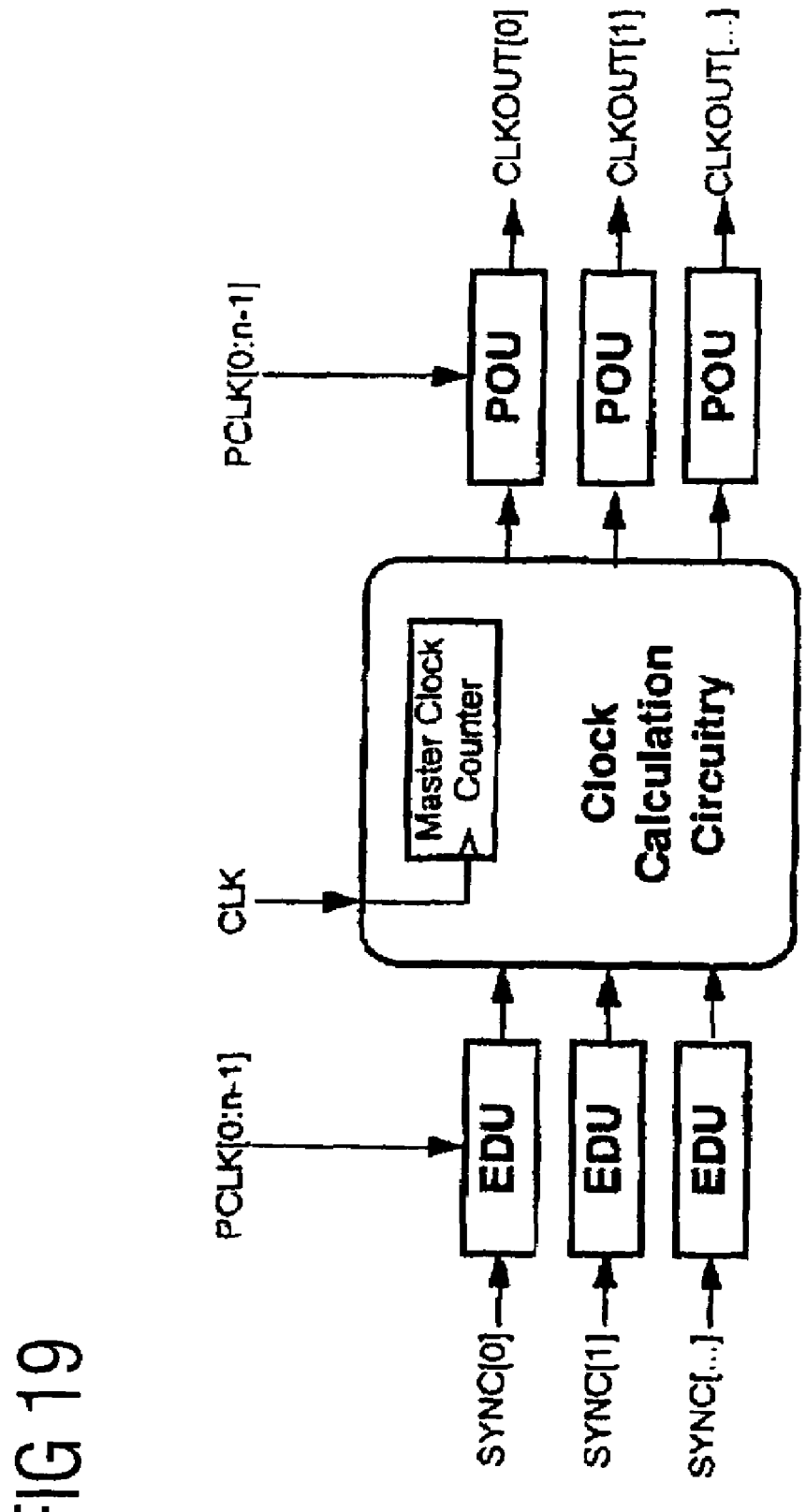
FIG. 19 is a block diagram of a system for an arbitrary clock synthesis according to an embodiment of the present invention.

FIG. 19 shows a block diagram of a system for an arbitrary clock synthesis according to an embodiment of the present invention. This system provides for the possibility to generate a plurality of arbitrary clocks (arbitrary clock synthesis).

The system includes a plurality of edge detection units EDU with respectively receive an external synchronization signal SYNC[ ] as well as the clock signals PCLK[ ] generated on the basis of the master clock signal by the DLL (FIG. 1. The output signals of the edge detection units EDU are supplied to a clock calculation circuitry CCC which further receives the master clock CLK. The CCC includes a master clock counter MCC. The CCC outputs the generated output signals to a plurality of phase overlay units POU which generate the desired clock signals CLKOUT[ ] (one or several) based on the signals as well as on the clock signals PCLK[ ].

According to this more general approach, an arbitrary number of clocks CLKOUT[ ] may be synthesized by the same multi-phase clock signal CLK, wherein the temporal course of the clock output may depend on an arbitrary number of synchronization signals SYNC[ ]. In this embodiment the master clock counter MCC is provided which is incremented in every master clock cycle, whereby a common time reference system is formed. By the use of this reference time stamps may be associated with every actual or also every hypothetical event (e.g. rising or falling edge) in the overall clock generation system. In order to express the temporal position of the event between discrete master clock events fractions with almost unlimited accuracy may be used.

Time stamps are associated with rising edges and falling edges of the external synchronization event, are, however, also associated with edge positions of potentially complex and irregular clock signals. The abstract term "time stamp" allows the arithmetic processing of the events. Arbitrary clock shapes may be calculated with it and clock signals with a predetermined relation to each other and to external events may easily be generated.

Figure 20:
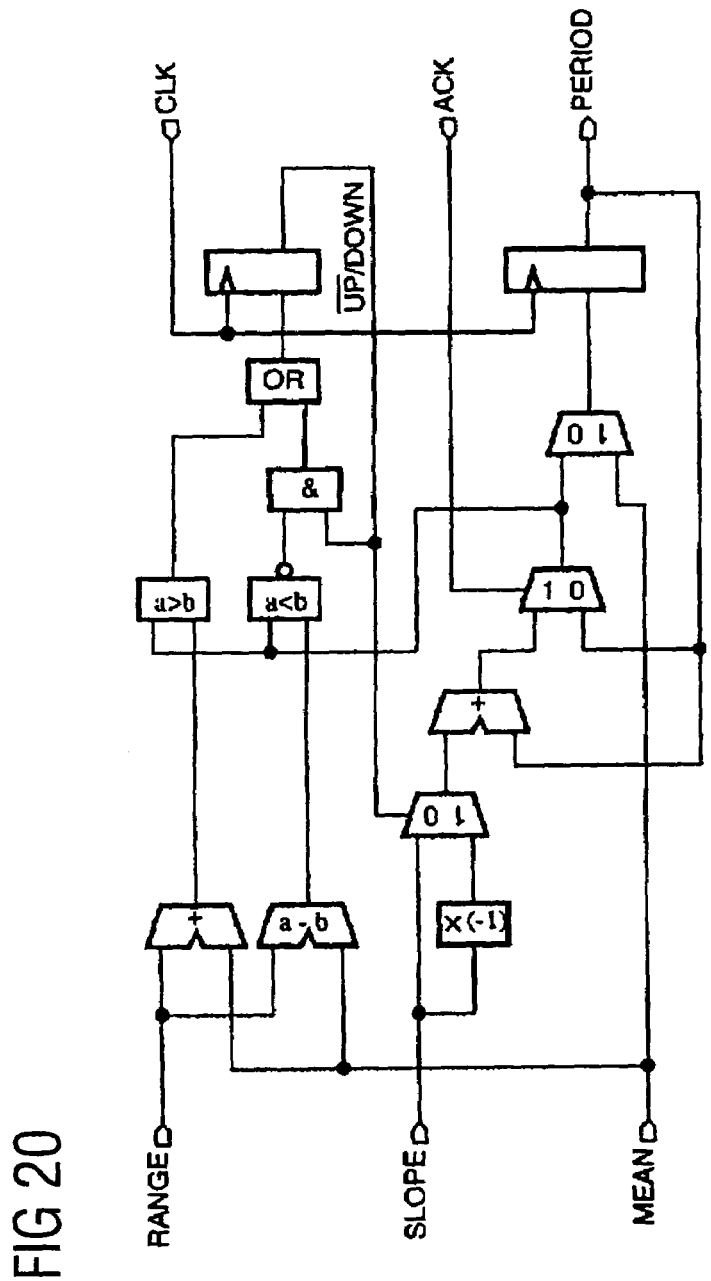
FIG. 20 is a spread spectrum interpolator.
Figure 21:
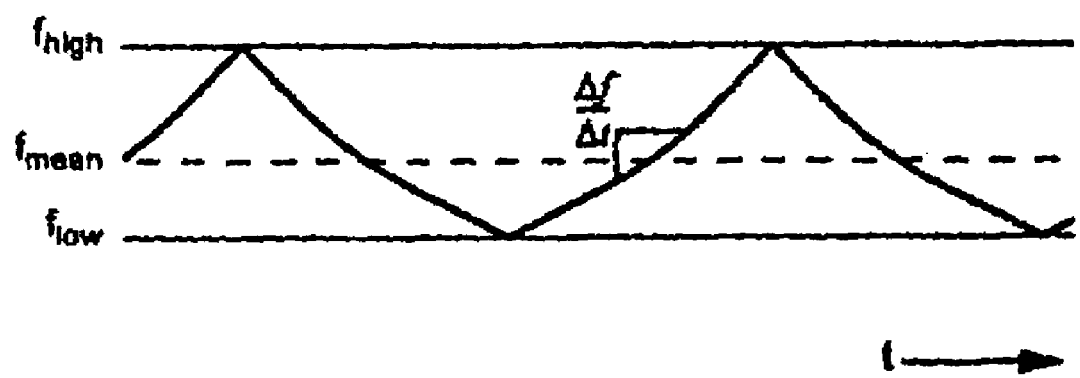
FIG. 21 is the sweep performance of the spread spectrum clock.

In the following, using FIG. 20 and 21 a further embodiment of the present invention is described. According to this embodiment a spread spectrum clock signal synthesis is performed. The period of the generated clock signal may be modulated in a simple way in the digital range. A circuit is provided, as is shown in FIG. 20, which serves to move the synthesized clock signal period between two extreme values using a definable inclination. The circuit shown in FIG. 20 is a spread spectrum interpolator which receives the clock signal as the input signal as well as a signal RANGE indicating the range, a signal SLOPE indicating the slope and a signal MEAN indicating the mean value. After each generated clock cycle the period is incremented by a period of delta value (SLOPE), until the period reaches an upper limit (MEAN+RANGE). After the upper limit is reached the current clock period is decremented again until the same reaches a lower limit (MEAN−RANGE). This is repeated in cycles so that the sweep performance indicated in FIG. 21 results.

The frequency shows non-linear changes over time, this is however as long as the modulation range is small (RANGE<<than MEAN), if the same is almost linear, the following calculation formula holds true:

$$f_{mean} = \frac{1}{t_{mean}} \quad f_{high} = \frac{1}{t_{mean} - t_{range}} \quad f_{low} = \frac{1}{t_{mean} + t_{range}}$$

$$\frac{\Delta f}{\Delta t} \cong \frac{t_{slope}}{(t_{mean})^3} = t_{slope} \cdot (f_{mean})^3$$

Figure 22:
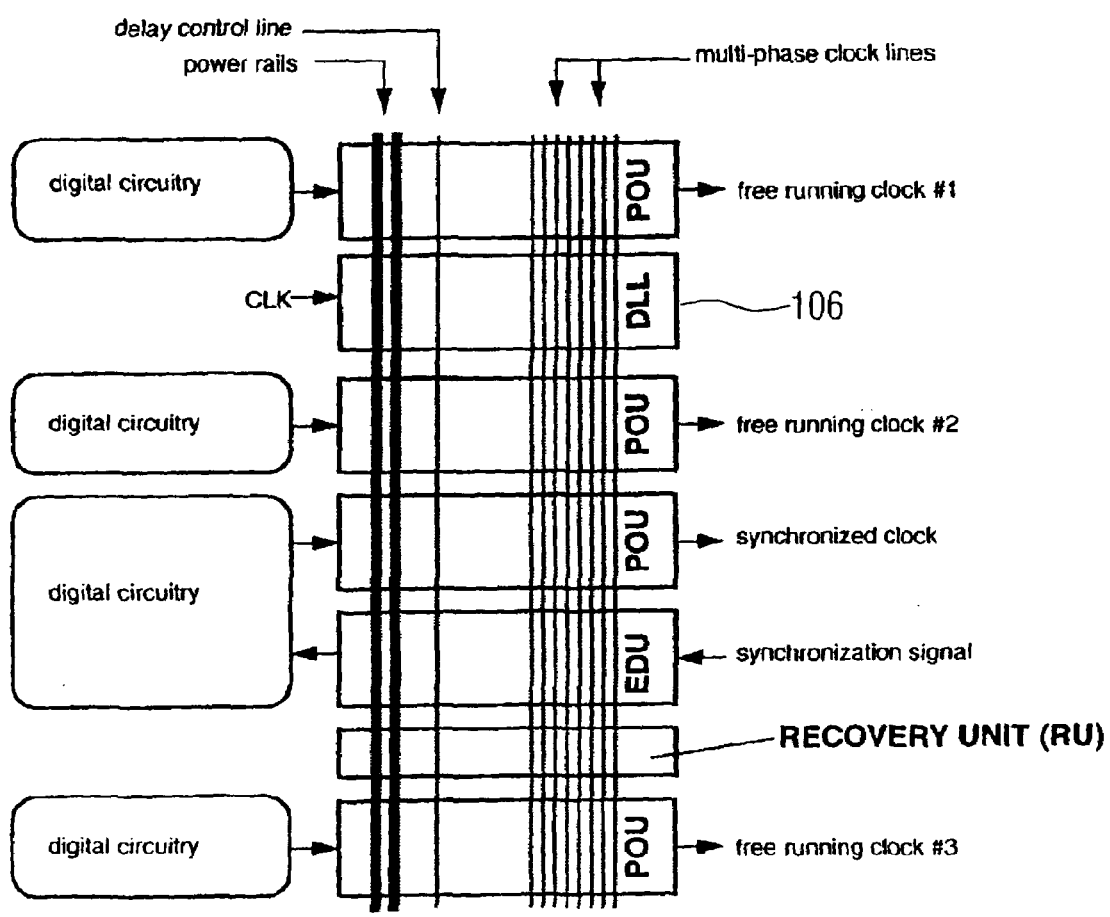
FIG. 22 is an example for a modular construction of the inventive clock generator.

Using FIG. 22 a possible implementation of the inventive method and the inventive device is described in more detail in modular construction. The digital clock signal synthesis is best implemented using a modular approach. The DLL circuit 106, the phase overlay unit POU and the edge detection unit EDU should be aligned with each other to enable a cascaded arrangement of the same. The DLL circuit 106 provides the multi-phase clock signals and the control voltage for the delay elements. All modules use a common power rail.

A maximum load for the multi-phase clock signals and the delay control voltage exist, so that for connecting a plurality of phase overlay units POU and edge detection units EDU a recovery unit RU may be inserted. Further, additional modules on the other side of the DLL 106 may be provided.

The phase overlay unit POU and the edge detection unit EDU are in principle digital units, for an exact delay control a suitable adjustment to the DLL circuit 106 according to analog design rules is advantageous, however.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for generating at least one desired clock signal having predetermined clock signal properties, comprising the following steps:
    a) providing a plurality of clock signals having substantially the same frequency and respectively different phase relations each with respect to a master clock signal;
    b) providing a control signal, the control signal including an enable signal sequence having a plurality of enable signals, wherein an enable signal for each of the plurality of clock signals is provided, and wherein the enable signal sequence indicates a frequency and a duty cycle of the desired clock signal to be generated;
    c) on the basis of the control signal, selecting predetermined clock signals from the plurality of provided clock signals; and
    d) combining the selected clock signals to generate the desired clock signal, and
    wherein each of the enable signals is provided delayed in order to set an alignment of each enable signal and the associated provided clock signal.

2. The method according to claim 1, wherein in step (b) the pulses with a high logic level of the selected clock signals are combined to generate the clock signal with a pulse with a high logic level and a predetermined pulse duration.

3. The method according to claim 1, wherein depending on the provided control signal the duration of the individual pulses having a high logic level, the duration of the individual pulses having a low logic level and the form of the pulse train of the clock signal to be generated is controlled.

4. The method according to claim 1, wherein the shortest duration of a pulse with a high logic level of the clock signal to be generated is determined by the duration of the pulse with a high logic level of the master clock signal, and wherein the shortest duration of a pulse with a low logic level of the clock signal to be generated is determined by the phase resolution of the plurality of clock signals.

5. The method according to claim 1, wherein the period of the generated clock signal is modulated in order to obtain a spread spectrum clock signal, wherein the method includes the following step after each generated clock signal cycle:
   incrementing the period by a predetermined value until an upper limit is reached;
   decrementing the period by a predetermined value until a lower limit is reached; and
   cyclic repetition of the incrementing and decrementing.

6. The method according to claim 1, wherein the step of providing the enable signal sequence includes the following steps:
   determining a position of the leading edge in the clock signal to be generated;
   determining a position of the trailing edge in the clock signal to be generated based on the position of the leading edge; and
   generating the enable signal sequence based on the position of the leading edge and of the position of the trailing edge.

7. The method according to claim 6, wherein the clock signal to be generated comprises a defined phase and frequency relation to a synchronization signal, with the following steps prior to determining the position of a leading edge:
   detecting signal state changes in the synchronization signal to generate an edge pattern;
   determining edges having a predetermined polarity in the edge pattern; and
   determining the period and the phase of the synchronized clock signal to be generated based on the determined edges of the synchronization signal.

8. The method according to claim 1, wherein during the generation of the clock signal a time stamp or several time stamps are generated.

9. The method according to claim 8, wherein a time stamp in a rising edge and/or in a falling edge of the generated clock signal is generated.

10. The method according to claim 8, wherein based on the master clock signal a time stamp or several time stamps are generated, which are associated with one or several external synchronization signals and/or the generated clock signal.

11. The method according to claim 10, wherein a relation between one or several edges of the generated clock signal and the edges of the external synchronization signal is determined based on the time stamps associated with these signals.

12. A device for generating at least one desired clock signal having a predetermined clock signal property, comprising:

a multi-phase clock generator for providing a plurality of clock signals having substantially the same frequency and respectively different phase relations with respect to a master clock signal; and a phase overlay unit for receiving a control signal, the control signal including an enable signal sequence having a plurality of enable signals, wherein an enable signal for each of the plurality of clock signals is provided, and wherein the enable signal sequence indicates a frequency and a duty cycle of the desired clock signal to be generated, wherein the phase overlay unit selects predetermined clock signals from the plurality of provided clock signals on the basis of the control signal, and combines the selected clock signals to generate the desired clock signal, and wherein each of the enable signals is provided delayed in order to set an alignment of each enable signal and the associated provided clock signal.

13. The device according to claim 12, comprising:
a primary edge interpolator for determining a position of a leading edge in the clock signal to be generated;
a secondary edge calculator for determining a position of the trailing edge in the clock signal to be generated based on the position of the leading edge; and
a phase enable unit to generate an enable signal sequence based on the position of the leading edge and on the position of the trailing edge.

14. The device according to claim 13, wherein the clock signal to be generated comprises a defined phase and frequency relation to a synchronization signal, comprising:
an edge detection unit to detect signal state changes in the synchronization signal in order to generate an edge pattern;
an edge position decoder in order to determine edges with a predetermined polarity in the edge pattern; and
a clock parameter calculator to determine the period and the phase for the synchronized clock signal to be generated based on the determined edges of the synchronization signal.

15. The device according to claim 12, wherein the period of the generated clock signal is modulated in order to obtain a spread spectrum clock signal, comprising
a spread spectrum interpolator in order to increment the period by a predetermined value after every generated clock signal cycle, until an upper limit is achieved, and to decrement the period by the predetermined value until a lower limit is achieved.

16. The device according to claim 12 comprising a generator for generating a time stamp or several time stamps.

17. The device according to claim 16, wherein the generator for generating a time stamp or several time stamps includes a clock calculation circuitry receiving the master clock and comprising a master clock counter, wherein the clock calculation circuitry generates a time stamp or several time stamps based on the master clock signal, which are associated with one or several external synchronization signals and/or the generated clock signal.

* * * * *